(12) United States Patent
Blanksby

(10) Patent No.: US 8,151,171 B2
(45) Date of Patent: Apr. 3, 2012

(54) OPERATIONAL PARAMETER ADAPTABLE LDPC (LOW DENSITY PARITY CHECK) DECODER

(75) Inventor: Andrew J. Blanksby, Orange, CA (US)

(73) Assignee: Broadcom Corporation, Irvine, CA (US)

( * ) Notice: Subject to any disclaimer, the term of this patent is extended or adjusted under 35 U.S.C. 154(b) by 1343 days.

(21) Appl. No.: 11/807,885

(22) Filed: May 30, 2007

(65) Prior Publication Data

US 2008/0282129 A1 Nov. 13, 2008

Related U.S. Application Data

(60) Provisional application No. 60/927,956, filed on May 7, 2007.

(51) Int. Cl.
H03M 13/45 (2006.01)
(52) U.S. Cl. .......................................... 714/780
(58) Field of Classification Search .................. 714/780
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 6,430,233 B1 | 8/2002 | Dillon et al. | |
| 6,473,010 B1 | 10/2002 | Vityaev et al. | |
| 6,567,465 B2 | 5/2003 | Goldstein et al. | |
| 6,633,856 B2 | 10/2003 | Richardson et al. | |
| 7,562,279 B2 * | 7/2009 | Zhang et al. | 714/752 |
| 2003/0104788 A1 | 6/2003 | Kim | |
| 2003/0229843 A1 | 12/2003 | Yu | |

FOREIGN PATENT DOCUMENTS

| KR | 10-2003-0095144 A | 12/2003 |
|---|---|---|
| KR | 10-2007-0039152 A | 4/2007 |

OTHER PUBLICATIONS

R. G. Gallager, "Low density parity check codes," IRE Trans. Info. Theory, vol. IT-8, Jan. 1962, pp. 21-28.

R. Gallager, Low-Density Parity-Check Codes, Cambridge, MA: MIT Press, 1963, 90 pages.

M. Luby. M. Mitzenmacher, M. A. Shokrollahi, D. A. Spielman, and V. Stemann, "Practical Loss-Resilient Codes," Proc. 29th Symp. on Theory of Computing, 1997, pp. 150-159.

(Continued)

Primary Examiner — Stephen Baker
(74) Attorney, Agent, or Firm — Garlick & Markison; Shayne X. Short

(57) ABSTRACT

Operational parameter adaptable LDPC (Low Density Parity Check) decoder. A novel means is presented by which LDPC coded signal can be decoded, and any one or more operational parameters can be adjusted during the decoding processing. For example, the original information extracted from a received LDPC coded signal (e.g., log likelihood ratios (LLRs)), can be modified during (or before) the iterative decoding processing performed in accordance with decoding an LDPC coded signal. Such modification of an operational parameter can include any one or combination of scaling, compression (and expansion/decompression), adding an offset to or subtracting an offset from, scaling, rounding, and/or some other modification of an operational parameter. The bit (or variable) edge messages and/or the check edge messages can also undergo modification during decoding processing. In addition, the operational parameter modification can be selective, in that, different modification can be performed to different parameters and/or during different decoding iterations.

51 Claims, 30 Drawing Sheets

OTHER PUBLICATIONS

T. J. Richardson and R. L. Urbanke, "The capacity of low-density parity-check code under message-passing decoding,'" IEEE Trans. Inform. Theory, vol. 47. No. 2, Feb. 2001, pp. 599-618.

Andrew J. Blanksby and Chris J. Howland, "A 690-mW 1-Gb/s 1024-b, rate-1/2 low-density parity-check code decoder," IEEE Journal of Solid-State Circuits, vol. 37, No. 3. Mar. 2002, pp. 404-412.

Tanner, R. M., "A recursive approach to low complexity codes," IEEE Transactions on Information Theory, vol. 42, 1981, pp. 533-547.

Manyuan Shen, Huaning Niu, Hui Liu, and J. A. Ritcey, J. A., Finite precision implementation of LDPC coded M-ary modulation over wireless channels: Conference Record of the Thirty-Seventh Asilomar Conference on Signals, Systems and Computers. 2003, Publication Date: Nov. 9-12, 2003, vol. 1, pp. 114-118, vol. 1 ISSN: ISBN: 0-7803-8104-1.

Shimizu, K., Ishikawa, T., Togawa, N., Ikenaga, T., and Goto, S., "Partially-parallel LDPC decoder based on high-efficiency message-passing algorithm," Proceedings of the 2005 International Conference on Computer Design (ICCD'05), 2005, 8 pages.

Yeo., E, Pakzad, P., Nikolic, B., and Anantharam. V., "VLSI architectures for iterative decoders in magnetic recording channels," IEEE Transactions on Magnetics, vol. 37, No. 2, 2001, pp. 748-755.

Zhang, T., Wang, Z., and Parhi, K., "On finite precision implementation of low density parity check codes decoder," Proceedings of ISCAS, Sydney, Australia, May 2001, pp. 202-205.

* cited by examiner

OPERATIONAL PARAMETER ADAPTABLE LDPC (LOW DENSITY PARITY CHECK) DECODER

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Application which is hereby incorporated herein by reference in its entirety and made part of the present U.S. Utility Patent Application for all purposes:

1. U.S. Provisional Application Ser. No. 60/927,956, entitled "Operational parameter adaptable LDPC (Low Density Parity Check) decoder," filed May 7, 2007.

BACKGROUND OF THE INVENTION

1. Technical Field of the Invention

The invention relates generally to communication systems; and, more particularly, it relates to decoding of LDPC (Low Density Parity Check) coded signals within such communication systems.

2. Description of Related Art

Data communication systems have been under continual development for many years. One such type of communication system that has been of significant interest lately is a communication system that employs iterative error correction codes. Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10GBASE-T) emerging standard) as well as communication systems operating within a wireless context (e.g., in the IEEE 802.11 context space including the IEEE 802.11n emerging standard).

For any of these particular communication system application areas, near-capacity achieving error correction codes are very desirable. The latency constraints, which would be involved by using traditional concatenated codes, simply preclude their use in such applications in very high data rate communication system application areas.

Generally speaking, within the context of communication systems that employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system). LDPC codes can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

In many such prior art communication devices, one of the greatest hurdles and impediments in designing effective devices and/or communication devices that can decode LDPC coded signals is the typically large area and memory required to store and manage all of the updated bit edge messages and check edge messages that are updated and employed during iterative decoding processing (e.g., when storing and passing the check edges messages and the bit edges messages back and forth between a check engine and a bit engine, respectively). When dealing with relatively large block sizes in the context of LDPC codes, the memory requirements and memory management need to deal with these check edges messages and bit edges messages can be very difficult to handle. There has been and continues to be a need in the art for better means by which LDPC coded signal can be decoded to extract the information encoded therein.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

LDPC (Low Density Parity Check) codes are capacity approaching forward error correcting codes (ECCs) that are being adopted in an increasing number of communication standards (e.g., IEEE 802.3an, IEEE 802.11n, 802.20, DVB-S2). Relevant application domains include magnetic recording, wireless, and high speed data transmission over copper and optical fiber.

In one embodiment, LDPC decoding processing is performed using an iterative decoding approach in which messages (e.g., check edge messages and bit edge messages) are passed back and forth when performing check node processing and bit node processing. This is sometimes refereed to as message passing decoding processing that operates on a graph representation of the code (e.g., a LDPC bipartite graph). One of the key hardware implementation challenges is the management of the large number of messages that must be exchanged during each decoder iteration. Herein, various approaches are presented that allow for the reduction of the number of bits required to represent each message without sacrificing coding performance. In addition, novel means are also presented by which operational parameter modification can be performed to any one or more of the various elements employed when performing decoding of an LDPC coded signal (e.g., check edge messages, bit edge messages, LLRs, soft information, etc.).

It is noted that any of the following embodiments and approaches described herein are applicable regardless of the overall LDPC decoder architecture, e.g., whether fully parallel, partially parallel, or serial in architecture/hardware implementation.

Figure 1:
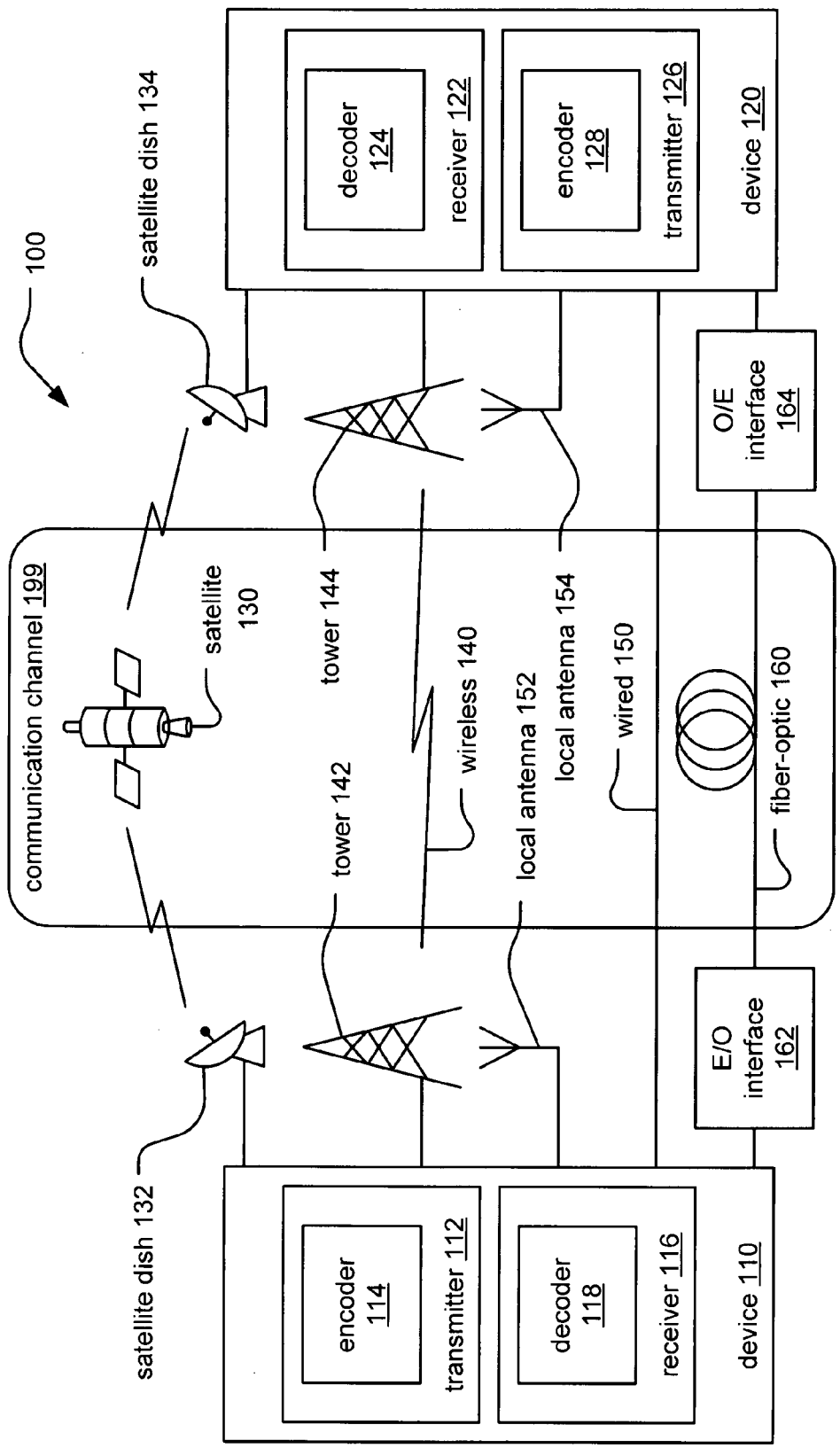
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
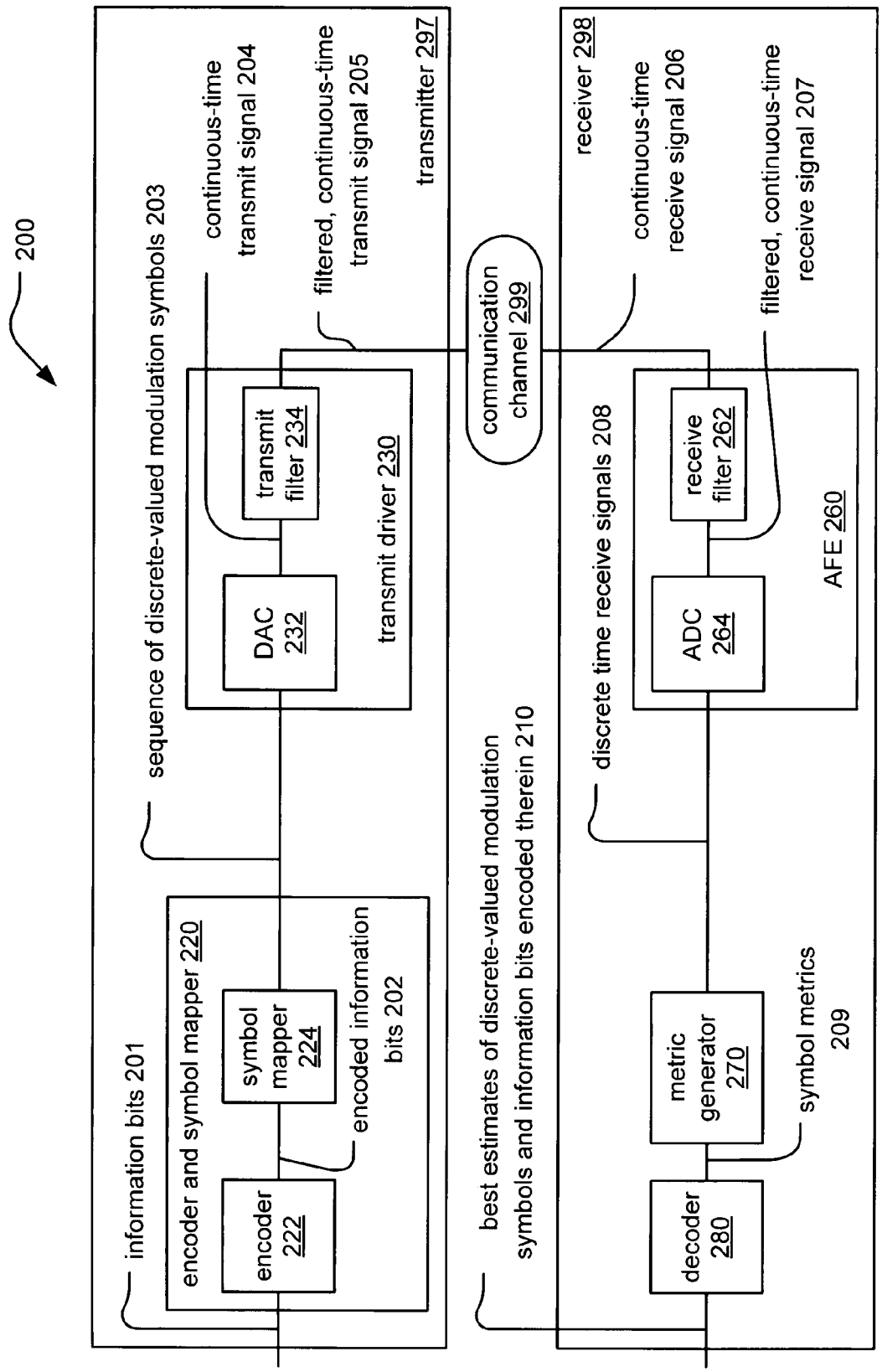

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signals. Before more details are provided below, a general description of LDPC codes is provided.

Figure 3:
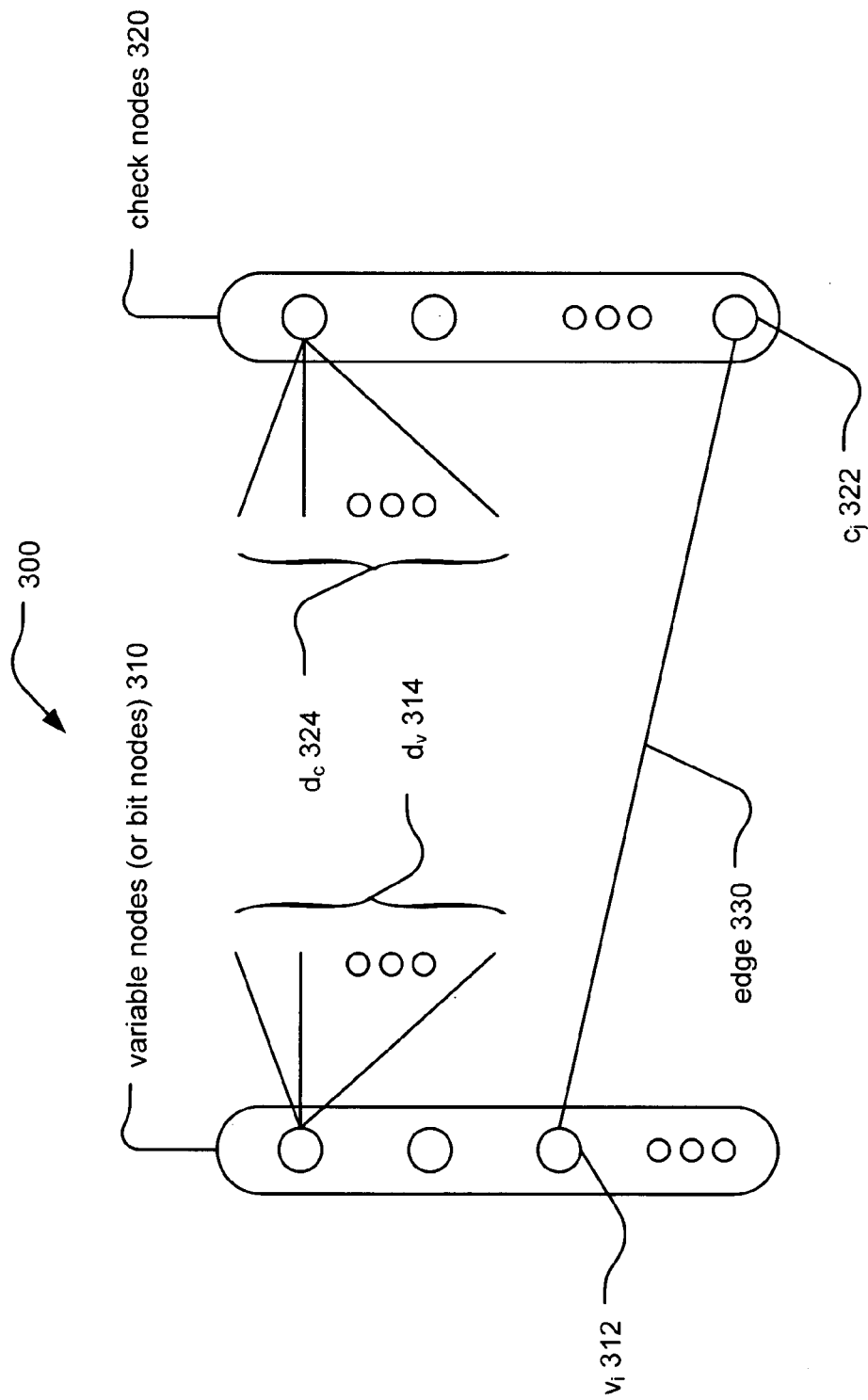
FIG. 3 illustrates an embodiment of an LDPC (Low Density Parity Check) code bipartite graph.

FIG. 3 illustrates an embodiment of an LDPC (Low Density Parity Check) code bipartite graph 300. In the art, an LDPC bipartite graph may also sometimes be referred to as a Tanner graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

LDPC codes are linear block codes and hence the set of all codewords $x \in C$ spans the null space of a parity check matrix, H.

$$Hx^T = 0, \forall x \in C \quad (1)$$

For LDPC codes, H, is a sparse binary matrix of dimension m×n. Each row of H corresponds to a parity check and a set element $h_{ij}$ indicates that data symbol j participates in parity check i. Each column of H corresponds to a codeword symbol.

For each codeword x there are n symbols of which m are parity symbols. Hence the code rate r is given by:

$$r = (n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$ and the number of 1's in the j-th row of the parity check matrix may be denoted as $d_c(j)$. If $d_v(i)=d_v$, for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes*, Cambridge, Mass.: MIT Press, 1963.

[2] M. G. Luby, M. Mitzenmacher, M. A. Shokrollahi, D. A. Spielman, and V. Stemann, "Practical Loss-Resilient Codes", *Proc. 29$^{th}$ Symp. on Theory of Computing*, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 (or sometimes referred to as a Tanner graph 300) of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 330 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 320 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by $e=(i, j)$. However, on the other hand, given an edge $e=(i, j)$, the nodes of the edge may alternatively be denoted as by $e=(v(e),c(e))$ (or $e=(b(e),$ c(e)))$. Alternatively, the edges in the graph correspond to the set elements of H where a set element $h_{ji}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$); these edges are referred to as bit edges, and the messages corresponding to these bit edges are referred to as bit edge messages.

Given a check node $c_j$, one may define the set of edges emitting from the node $c_j$ by $E_c(j)=\{e|c(e)=j\}$ these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as a graph code. It is also noted that an irregular LDPC code may also described using a bipartite graph. However, the degree of each set of nodes within an irregular LDPC code may be chosen according to some distribution. Therefore, for two different variable nodes, $v_{i_1}$, and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al. in [2] referenced above and also within the following reference [3]:

[3] T. J. Richardson and R. L. Urbanke, "The capacity of low-density parity-check code under message-passing decoding," *IEEE Trans. Inform. Theory*, Vol. 47, No. 2, February 2001, pp. 599-618.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes.

It is also noted that many of the embodiments described herein employ the terminology of "bit node" and "bit edge message", or equivalents thereof. Oftentimes, in the art of LDPC decoding, the "bit node" and "bit edge message" are alternatively referred to as "variable node" and "variable edge message", in that, the bit values (or variable values) are those which are attempted to be estimated. Either terminology can be employed in accordance with certain aspects of the invention.

Figure 4:
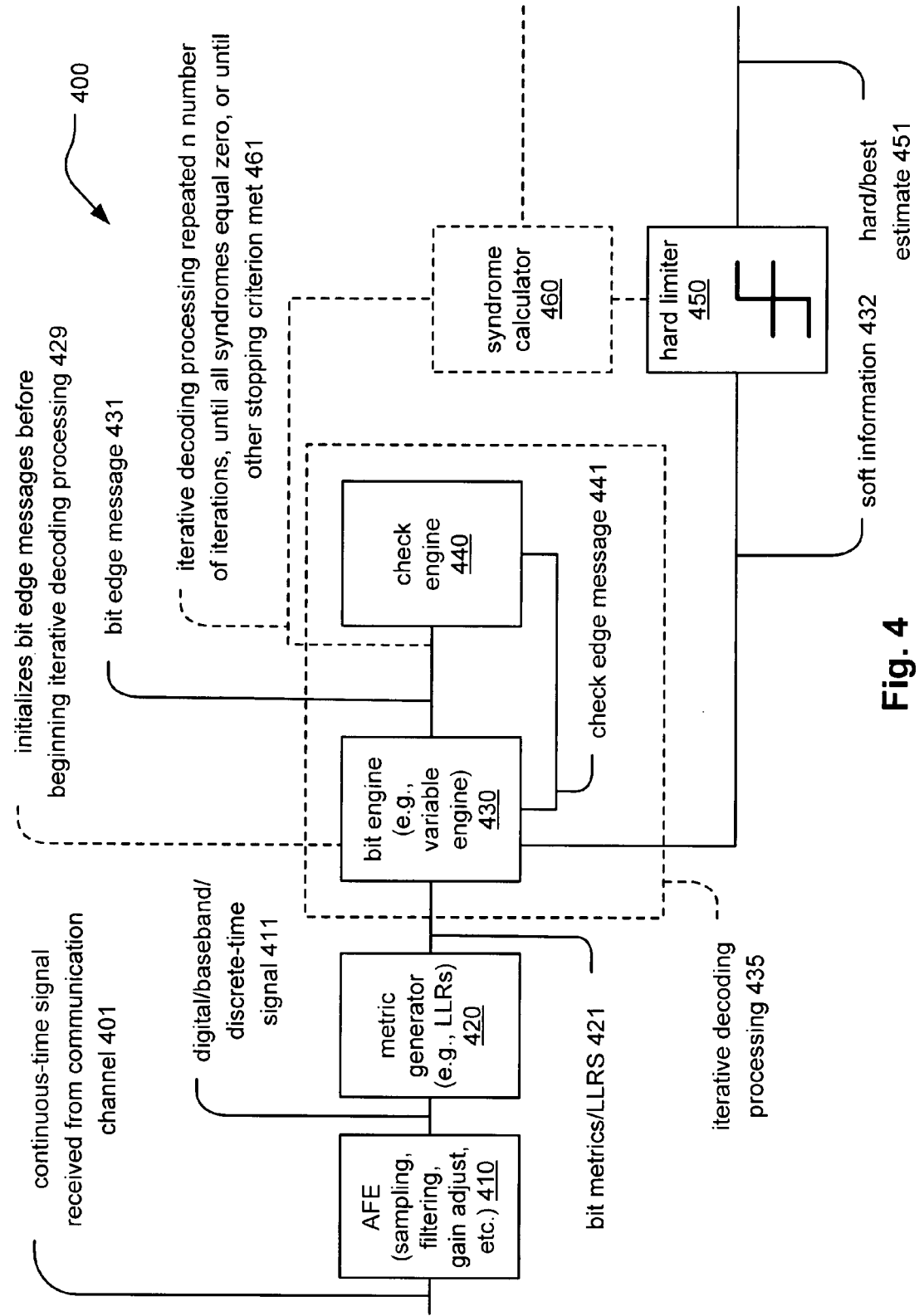
FIG. 4 illustrates an embodiment of LDPC decoding functionality.

FIG. 4 illustrates an embodiment of LDPC decoding functionality 400. To perform decoding of an LDPC coded signal having an m-bit signal sequence, the functionality of this diagram may be employed. Generally speaking, a continuous-time signal is received from a communication channel, as shown by reference numeral 401. The communication channel can be any type of channel including, though not limited to, a wireline communication channel, a wireless communication channel, a fiber-optic communication channel, a read channel of a HDD, or other type of communication channel capable to carrying a continuous-time signal that has been coded using an LDPC code.

An analog front-end (AFE) 410 is operable to perform any initial processing on the continuous-time signal (e.g., by performing any one or more of filtering (analog and/or digital filtering), gain adjustment, etc.) and digital sampling thereby a discrete-time signal 411. This discrete-time signal 411 can alternatively be referred to as a digital signal, a baseband signal, or other appropriate terminology known in the art. Oftentimes, the discrete-time signal 411 is partitioned into I, Q (In-phase, Quadrature) values of the signal.

A metric generator 420 is operable to receive the discrete-time signal 411 (e.g., which can include the I, Q values thereof) and to calculate the corresponding bit metrics and/or log likelihood ratios (LLRs) 421 that correspond to the received values within the discrete-time signal 411. In some embodiments, the calculation of these bit metrics/LLRs symbol metrics 421 is a two-step process, in which, the metric generator 420 firstly is operable to calculate symbol metrics corresponding to the symbols of the discrete-time signal 411, an then the metric generator secondly is operable to employ the symbol metrics to decompose those symbol metrics into the bit metrics/LLRs 421. These bit metrics/LLRs 421 are then employed by a bit engine 430 to initialize the bit edge messages (e.g., as shown by reference numeral 429) that are employed when performing iterative decoding processing 435 (e.g., as performed by the bit engine 430 and a check engine 440) of the LDPC coded signal.

The initialization of the bit edge messages for each variable node i with the value of the log-likelihood ratio (LLR), $\lambda_i$, of the corresponding received symbol, $y_i$, defined as follows:

$$\lambda_i = \ln\left[\frac{Pr(x_i = 0 \mid y_i)}{Pr(x_i = 1 \mid y_i)}\right] \quad (3)$$

Also, at the bit nodes, a bit engine 430 is operable to compute the corresponding soft information of the bits (e.g., shown as soft information 432) using the most recently updated bit edge messages. However, it is common for multiple decoding iterations to be performed, so the initialized bit edge messages are passed to the check engine 440 where, during a first decoding iteration, the check engine 440 is operable to employ the initialized bit edge messages to update check edge messages.

At each check node, the LDPC decoding processing forms a parity check result (XOR) on the sign of the incoming messages. This operates by finding the sign of each outgoing message as the XOR of the sign of the corresponding incoming message with the parity check result.

The decoding processing then calculates the outgoing message reliability from check node j to the bit (e.g., variable) node i according to:

$$\lambda_{ji} = 2\tanh^{-1}\left(\prod_{k,h_{jk}=1,k\neq i} \tanh\left(\frac{\lambda_{jk}}{2}\right)\right) \quad (4)$$

In some desired embodiments, this calculation is performed in the log domain to transform the multiplication into a sum as follows:

$$\lambda_{ji} = 2\tanh^{-1}\left[\exp\left\{\sum_{k,h_{jk}=1,k\neq i} \log\left[\tanh\left(\frac{\lambda_{jk}}{2}\right)\right]\right\}\right] \quad (5)$$

Thereafter, the bit engine 430 is operable to receive the updated edge messages (e.g., shown as check edge message 441) from the check engine 440 and to employ them to update the bit edge messages. Also, the bit engine 430 is operable to employ the bit metrics/LLRs 421 that are received from the metric generator 420 when performing the updating of the bit edge messages in accordance with LDPC decoding. Also, these updated check edge messages 441 are then passed back to the bit nodes (e.g., to the bit engine 430) where the soft information 432 of the bits is calculated using the bit metrics/LLRs 421 and the current iteration values of the check edge messages. At each bit (e.g., variable) node, the calculation of the soft information involves forming the sum of the LLR of the received symbol with the incoming messages from the check node (e.g., the check edge messages 441). The decoded bit $\hat{x}_i$ is given by the sign of the summation. Each outgoing message for the next decoder iteration is computed by subtracting the corresponding incoming message from the summation. To continue with the iterative decoding processing 435, these bit edge messages 431, after being updated, are then passed to the check engine 440.

Another decoding iteration can be performed, in that, at the check nodes, the check engine 440 is then operable to receive these updated bit edge messages 431 sent from the bit nodes (e.g., from the bit engine 430) and updates the check edge messages accordingly. These updated check edge messages 441 are then passed back to the bit nodes (e.g., to the bit engine 430) where the soft information 432 of the bits is calculated using the bit metrics/LLRs 421 and the current iteration values of the check edge messages. Thereafter, using this just calculated soft information 432 of the bits, the bit engine 430 again is operable to update the bit edge messages using the previous values of the check edge messages (from the just previous iteration). The iterative processing 435 continues between the bit nodes and the check nodes according to the LDPC code bipartite graph that was employed to encode the signal that is being decoded.

These iterative decoding processing steps, performed by the bit node engine 430 and the check node engine 440, are repeated until a stopping criterion is met as shown by reference numeral 461 (e.g., after a predetermined or adaptively determined number of iterations have been performed, after all syndromes of the LDPC code are all equal to zero (e.g., all of the parity checks are satisfied), and/or other stopping criterion has been met). Another possible means by which LDPC decoding can be stopped is when the current estimate of the LDPC codeword, $\hat{x}$, satisfies the following relationship:

$$H\hat{x}^T = 0$$

Soft information 432 can be generated within the bit engine 430 during each of the decoding iterations. In this embodiment, this soft information 432 may be provided to a hard limiter 450 where hard decisions may be made, and that hard information (e.g., hard/best estimate 451) may be provided to a syndrome calculator 460 that is operable to determine whether the syndromes of the LDPC code are all equal to zero. That is to say, the syndrome calculator 460 is operable to determine whether each syndrome associated with the LDPC code is equal to zero, based on the current estimate of the LDPC codeword.

When the syndromes are not equal to zero, the iterative decoding processing 435 can continue again by appropriately updating and passing the bit edge messages and the check edge messages between the bit engine 430 and the check engine 440, respectively. After all of these iterative decoding processing steps have been performed, then the hard/best estimates 451 of the bits are output based on the soft information 432.

Also, it is noted that for good decoding performance, it is important that the lengths of cycles in the graph are as long as possible. Short cycles, such as the length 4 cycle, can possibly degrade the performance of the message passing decoding approach to decoding an LDPC coded signal.

While the mathematics of the message passing decoding approach contains hyperbolic and logarithmic functions (e.g., see equation (5) above), in a hardware implementation these functions can alternatively be approximated by look-up tables (LUTs) or directly instantiated in logic gates. The arithmetic computation involves only additions, subtractions, and XOR operations. The number of bits required in fixed point implementation is determined by the required coding performance, speed of decoder convergence, and whether an error floor must be suppressed as described in reference [4].

[4] Zhang, T., Wang, Z., and Parhi, K., "On finite precision implementation of low density parity check codes decoder," *Proceedings of ISCAS*, Sydney, Australia, May 2001, pp 202-205.

One of the main challenges for implementing the message passing decoding processing for decoding LDPC codes is managing the passing of the messages. Some of the key issues include the large number of messages that must be exchanged and the required access pattern of the messages.

The message bandwidth $M_{bw}$ of an LDPC code with average column weight $\Lambda_{ave}$ is given by reference [5] and is listed as follows:

[5] Andrew J. Blanksby and Chris J. Howland, "A 690 mW 1-Gb/s 1024-b, rate-½ low-density parity-check code decoder," *IEEE Journal of Solid-State Circuits*, Vol. 37, No. 3, March 2002, pp 404-412.

$$M_{bw}=2\Lambda_{ave}\cdot W\cdot N\cdot T \qquad (6)$$

where W is the number of bits used to represent each message, N is the number of decoder iterations, T is the target coded throughput in bits/second, and the factor of 2 includes both variable and check messages. It is noted that the message bandwidth is independent on the length of the code n. As an example, for the 10 G Base-T (802.3an) application the coded bit throughput is 6.4 Gb/s, the average column weight is 6, and assuming 8-bit messages, and 20 decoder iterations, the required message bandwidth is 12,288 Gbit/s (or 1536 Gbyte/s).

High message bandwidth translates into complexity in the memory architecture required to achieve the necessary read/write speed. For medium throughput applications multiple banks of memories and large multiplexers are needed as described in reference [6], while for high throughput applications memories are too slow and the messages must be stored in registers. High message bandwidth also corresponds to high dynamic power consumption.

[6] Yeo., E, Pakzad, P., Nikolic, B., and Anantharam, V., "VLSI architectures for iterative decoders in magnetic recording channels," *IEEE Transactions on Magnetics*, Vol. 37, No. 2, 2001, pp 748-755.

For LDPC codes to achieve good coding performance, the code structure is either random or based on a complex permutation. This leads to a lack of regularity in the message access pattern. For memory based architectures an interconnect fabric and schedule must be developed and the storage requirements for the schedule itself can be significant as described in reference [7]. For parallel or partially parallel architectures where messages are represented as wires and registers, the code structure leads to substantial routing complexity as described in reference [5] cited above.

[7] Shimizu, K., Ishikawa, T., Togawa, N., Ikenaga, T., and Goto, S., "Partially-parallel LDPC decoder based on high-efficiency message-passing algorithm," *Proceedings of the 2005 International Conference on Computer Design (ICCD '05)*, 2005, 8 pages.

In looking at equation (6) the column weight is determined by the code structure required to meet the coding performance needed, and the throughput is fixed by the standard. The only two parameters that could potentially be changed to reduce the message bandwidth are the number of decoder iterations, and the number of bits used to represent each message.

The average number of decoder iterations can be reduced by testing Equation (1) after each iteration to determine if the algorithm has converged to a correct codeword. However, if there is to be no loss in coding performance the decoder must still be designed to implement the maximum number of iterations for the worst case.

Techniques for reducing the number of bits required to implement each message must minimize any loss of coding performance, not decrease the speed of decoder convergence, and not introduce an error floor as described in reference [8]. The relatively short block length n of most LDPC codes used in practical applications means that short cycles in the code structure are inevitable which renders the message passing decoding algorithm suboptimal. Reducing the precision with which messages are represented exacerbates this problem and can prevent the decoder converging to the correct codeword and instead it becomes trapped in a limit cycle.

[8] Manyuan Shen, Huaning Niu, Hui Liu, and J. A. Ritcey, J. A., "Finite precision implementation of LDPC coded M-ary modulation over wireless channels," *Conference Record of the Thirty-Seventh Asilomar Conference on Signals, Systems and Computers*, 2003, Publication Date: 9-12 Nov. 2003, Volume: 1, pp. 114-118, Vol. 1 ISSN: ISBN: 0-7803-8104-1.

FIG. 5, FIG. 6, FIG. 7, FIG. 8, and FIG. 9 illustrate alternative embodiments of at least a portion of LDPC decoding functionality. These embodiments have at least some analogous features when compared to the LDPC decoding functionality 400 of the FIG. 4.

Figure 5:
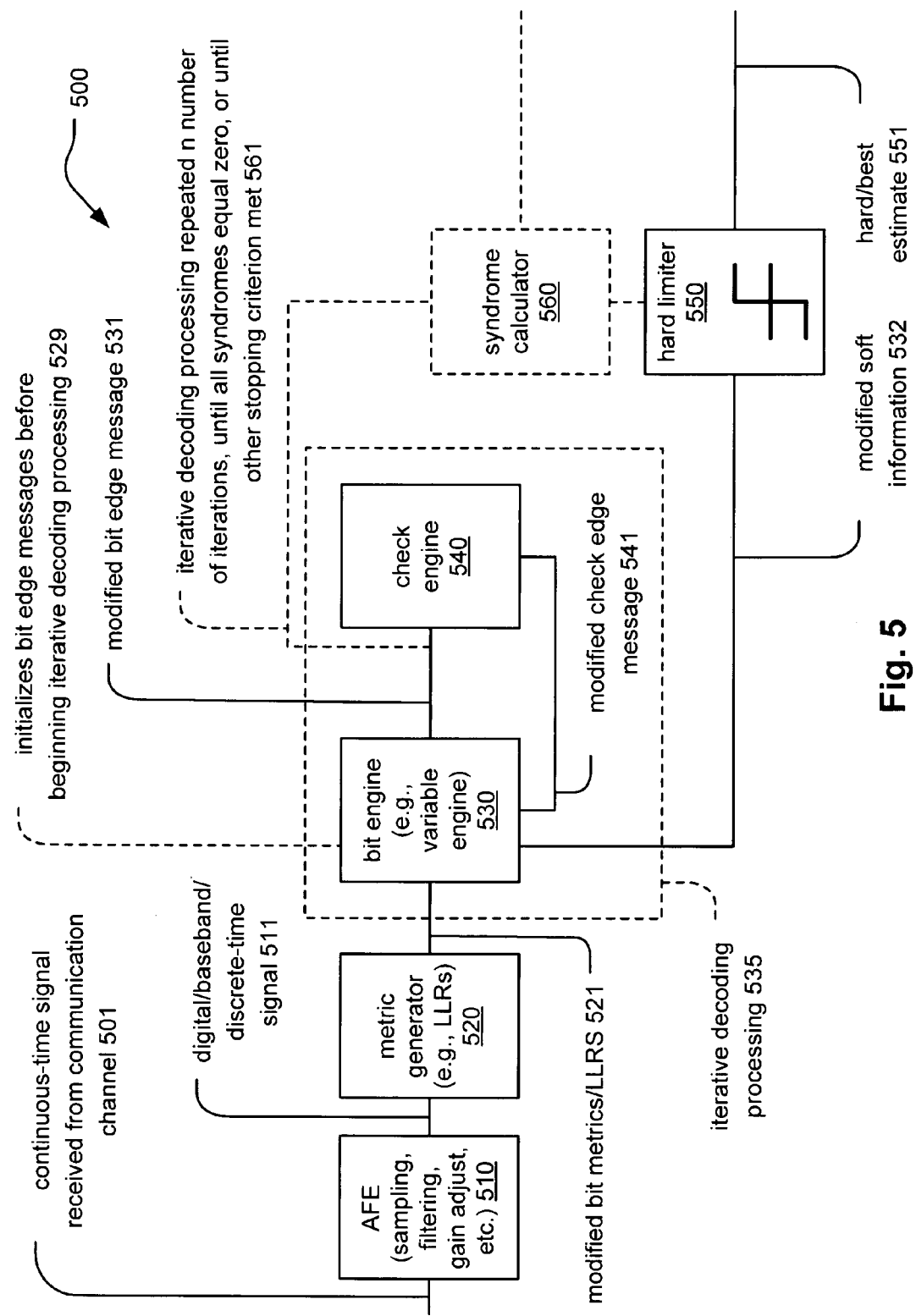
FIG. 5, FIG. 6, FIG. 7, FIG. 8, and FIG. 9 illustrate alternative embodiments of at least a portion of LDPC decoding functionality.

Referring to the LDPC decoding functionality 500 of FIG. 5, this embodiment also receives a continuous-time signal from a communication channel, as shown by reference numeral 501. Thereafter, an AFE 510 is operable to generate a discrete-time signal 511 there from.

However, when calculating bit metrics/LLRs using the discrete-time signal 511, a metric generator 520 is operable to calculate modified bit metrics/LLRs 521. These modified bit metrics/LLRs 521 are different than the bit metrics/LLRs 421 of the previous embodiment, in that, the metric generator 520 is operable to calculate bit metrics/LLRs (e.g., in a manner similar to the previous embodiment), but then the metric generator 520 is operable to modify those originally calculated bit metrics/LLRs thereby generating the modified bit metrics/LLRs 521. This modification can be performed using any of a variety of means including scaling, adding a first offset to and/or subtracting a second offset from, compressing, expanding, and/or some other means.

These modified bit metrics/LLRs 521 are then employed by a bit engine 530 to initialize the bit edge messages (e.g., as shown by reference numeral 529) that are employed when performing iterative decoding processing 535 (e.g., as performed by the bit engine 530 and a check engine 540) of the LDPC coded signal.

Also, at the bit nodes, a bit engine 530 is operable to compute the corresponding modified soft information of the bits (e.g., shown as modified soft information 532) using the most recently updated bit edge messages. This modified soft information 532 can be viewed as being different from the soft information 432 from the previous embodiment, in that, the modified soft information 532 has undergone some modification in accordance with any of a variety of means including scaling, adding a first offset to and/or subtracting a second offset from, compressing, expanding, and/or some other means.

Again, as with the previous embodiment, it is common for multiple decoding iterations to be performed, so the initialized (and modified, if desired) bit edge messages are passed to the check engine 540 where, during a first decoding iteration, the check engine 540 is operable to employ the initialized (and sometimes modified) bit edge messages to update check edge messages. Thereafter, the bit engine 530 is operable to receive modified updated edge messages (e.g., shown as modified check edge message 541) from the check engine 540 and to employ them to update the bit edge messages. The modified check edge message 541 is generated after the check edge messages have undergone some modification in accordance with any of a variety of means including scaling, adding a first offset to and/or subtracting a second offset from, compressing, expanding, and/or some other means.

Also, the bit engine 530 is operable to employ the modified bit metrics/LLRs 521 that are received from the metric generator 520 when performing the updating of the bit edge messages in accordance with LDPC decoding. Also, these updated, modified check edge messages 541 are then passed back to the bit nodes (e.g., to the bit engine 530) where the modified soft information 532 of the bits is calculated using the modified bit metrics/LLRs 521 and the current iteration values of the check edge messages. To continue with the iterative decoding processing 535, these modified bit edge messages 531, after being updated, are then passed to the check engine 540. The iterative processing 535 continues between the bit nodes and the check nodes according to the LDPC code bipartite graph that was employed to encode the signal that is being decoded.

These iterative decoding processing steps, performed by the bit node engine 530 and the check node engine 540, are repeated until a stopping criterion is met as shown by reference numeral 561 (e.g., after a predetermined or adaptively determined number of iterations have been performed, after all syndromes of the LDPC code are all equal to zero, and/or other stopping criterion has been met).

Modified soft information 532 can be generated within the bit engine 530 during each of the decoding iterations. In this embodiment, this modified soft information 532 may be provided to a hard limiter 550 where hard decisions may be made, and that hard information (e.g., hard/best estimate 551) may be provided to a syndrome calculator 560 that is operable to determine whether the syndromes of the LDPC code are all equal to zero. That is to say, the syndrome calculator 560 is operable to determine whether each syndrome associated with the LDPC code is equal to zero, based on the current estimate of the LDPC codeword.

When the syndromes are not equal to zero, the iterative decoding processing 535 can continue again by appropriately updating and passing the bit edge messages and the check edge messages between the bit engine 530 and the check engine 540, respectively. After all of these iterative decoding processing steps have been performed, then the hard/best estimates 551 of the bits are output based on the soft information 532.

This embodiment of the FIG. 5 differs from the embodiment of the FIG. 4, in at least that, the information that is passed between the various engines, processing modules, etc. is "modified" information. Again, such modification can be any one, or combination thereof, of a variety of means including scaling, adding a first offset to and/or subtracting a second offset from, compressing, expanding, and/or some other means.

Figure 6:
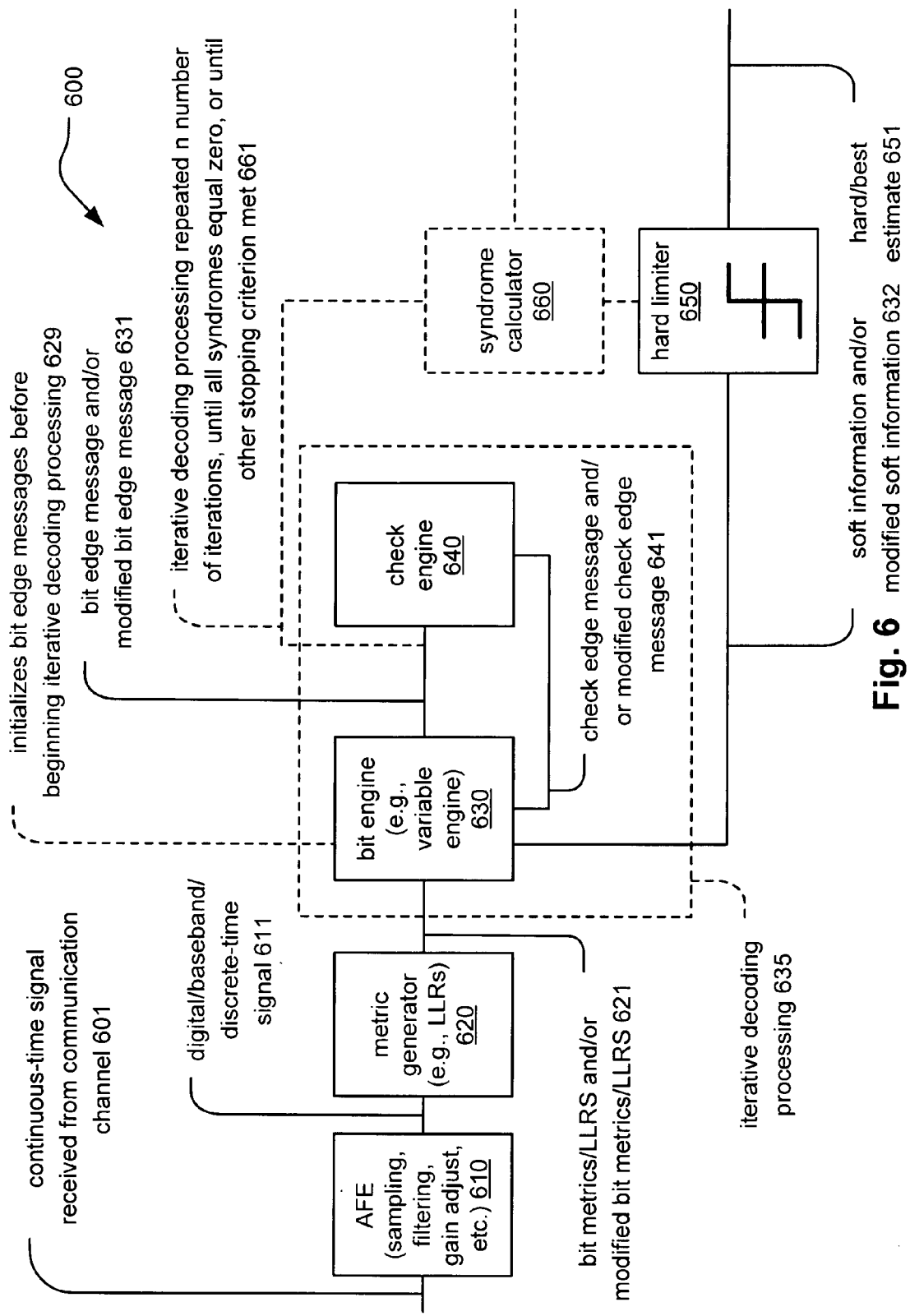

The following embodiment of FIG. 6 is somewhat analogous to that of the FIG. 5, with at least one difference being that for each of the types of information that are calculated in each engine, processing module, etc., either that information (without undergoing modification) or a modified version of that information can be passed to a subsequent engine, processing module, etc. for use in the decoding processing. That is to say, there is a selective providing of the information or the modified information from each of the engines, processing modules, etc. in the embodiment of FIG. 6.

Referring to the LDPC decoding functionality 600 of FIG. 6, this embodiment also receives a continuous-time signal from a communication channel, as shown by reference numeral 601. Thereafter, an AFE 610 is operable to generate a discrete-time signal 611 there from.

However, when calculating bit metrics/LLRs using the discrete-time signal 611, a metric generator 620 is operable to calculate one or both metrics/LLRs and modified bit metrics/LLRs 621. Again, these modified bit metrics/LLRs 621 are different than the bit metrics/LLRs 421 of one of the previous embodiments, in that, the metric generator 620 is operable to calculate bit metrics/LLRs (e.g., in a manner similar to the previous embodiment), but then the metric generator 620 is operable to modify those originally calculated bit metrics/LLRs thereby generating the modified bit metrics/LLRs 621. This modification can be performed using any of a variety of means including scaling, adding a first offset to and/or subtracting a second offset from, compressing, expanding, and/or some other means.

The bit metrics/LLRs and/or the modified bit metrics/LLRs 621 are then employed by a bit engine 630 to initialize the bit edge messages (e.g., as shown by reference numeral 629) that are employed when performing iterative decoding processing 635 (e.g., as performed by the bit engine 630 and a check engine 640) of the LDPC coded signal. In some embodiments, the metric generator 620 can be implemented to calculate only one of the bit metrics/LLRs or the modified bit metrics/LLRs 621 (i.e., either only the bit metrics/LLRs or only the modified bit metrics/LLRs) to save computational resources, time, or some other system resource.

Also, at the bit nodes, a bit engine 630 is operable to compute one or both of corresponding soft information and modified soft information of the bits (e.g., shown as soft information and/or modified soft information 632) using the most recently updated bit edge messages (and/or modified bit edge messages).

Again, as with previous embodiments, it is common for multiple decoding iterations to be performed, so the initialized (and modified, if desired) bit edge messages are passed to the check engine 640 where, during a first decoding iteration, the check engine 640 is operable to employ the initialized bit edge messages (and/or modified bit edge messages) to update check edge messages. Thereafter, the bit engine 630 is operable to receive updated (and modified, if desired) edge messages (e.g., shown as check edge messages and/or modified check edge message 641) from the check engine 640 and to employ them to update the bit edge messages (and/or modified bit edge messages).

Also, the bit engine 630 is operable to employ the bit metrics/LLRs and/or modified bit metrics/LLRs 621 that are received from the metric generator 620 when performing the updating of the bit edge messages in accordance with LDPC decoding. Also, these updated, check edge messages or modified check edge messages 641 are then passed back to the bit nodes (e.g., to the bit engine 630) where the soft information and/or modified soft information 632 of the bits is calculated using the bit metrics/LLRs and/or modified bit metrics/LLRs 621 and the current iteration values of the check edge messages. The iterative processing 635 continues between the bit nodes and the check nodes according to the LDPC code bipartite graph that was employed to encode the signal that is being decoded.

These iterative decoding processing steps, performed by the bit node engine 630 and the check node engine 640, are repeated until a stopping criterion is met as shown by reference numeral 661 (e.g., after a predetermined or adaptively determined number of iterations have been performed, after all syndromes of the LDPC code are all equal to zero, and/or other stopping criterion has been met).

Soft information and/or modified soft information 632 can be generated within the bit engine 630 during each of the decoding iterations. In this embodiment, this soft information and/or modified soft information 632 may be provided to a hard limiter 650 where hard decisions may be made, and that hard information (e.g., hard/best estimate 651) may be provided to a syndrome calculator 660 that is operable to determine whether the syndromes of the LDPC code are all equal to zero. That is to say, the syndrome calculator 660 is operable to determine whether each syndrome associated with the LDPC code is equal to zero, based on the current estimate of the LDPC codeword.

When the syndromes are not equal to zero, the iterative decoding processing 635 can continue again by appropriately updating and passing the bit edge messages and the check edge messages between the bit engine 630 and the check engine 640, respectively. After all of these iterative decoding processing steps have been performed, then the hard/best estimates 651 of the bits are output based on the soft information 632.

Figure 7:
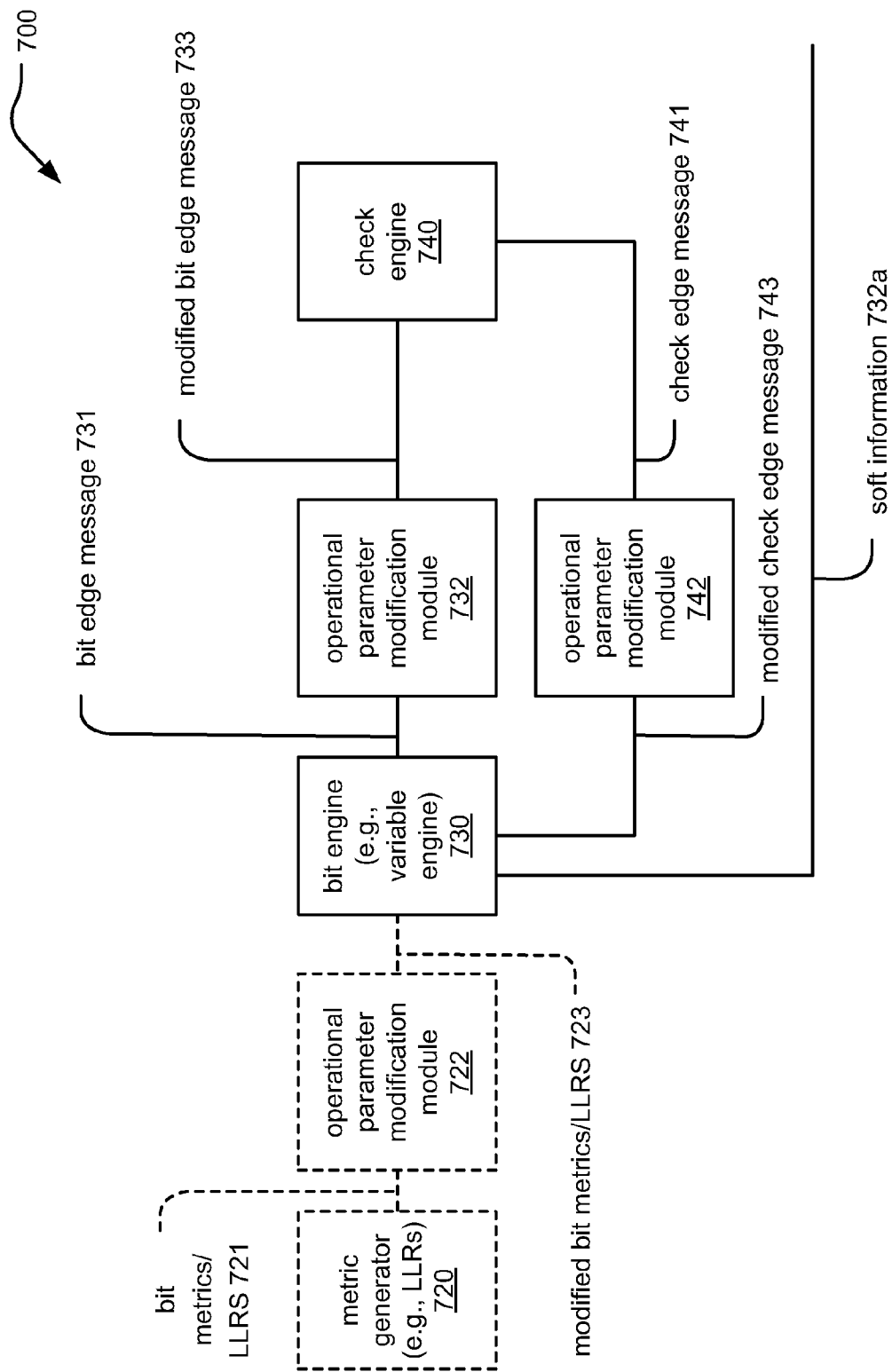
Figure 8:
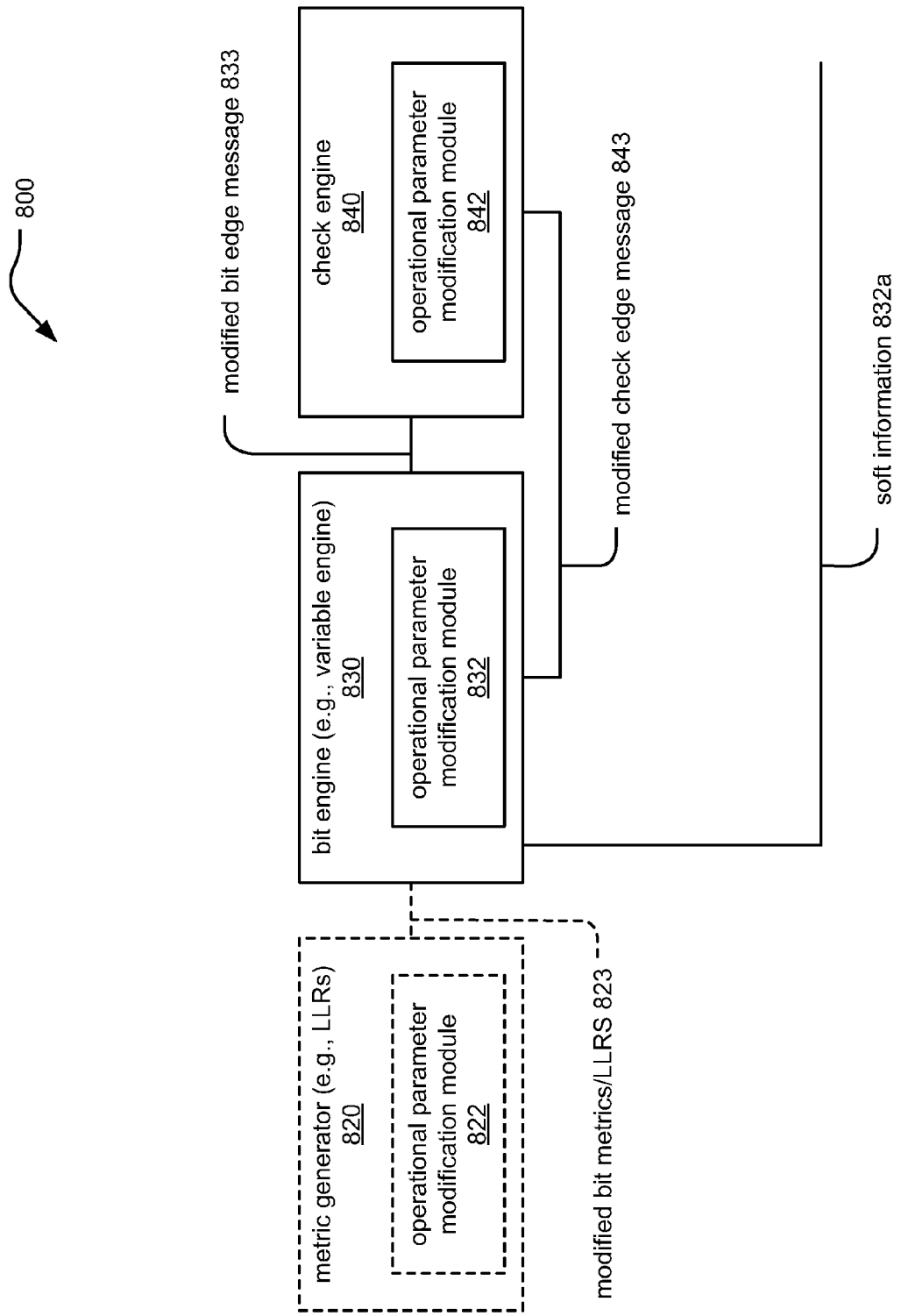
Figure 9:
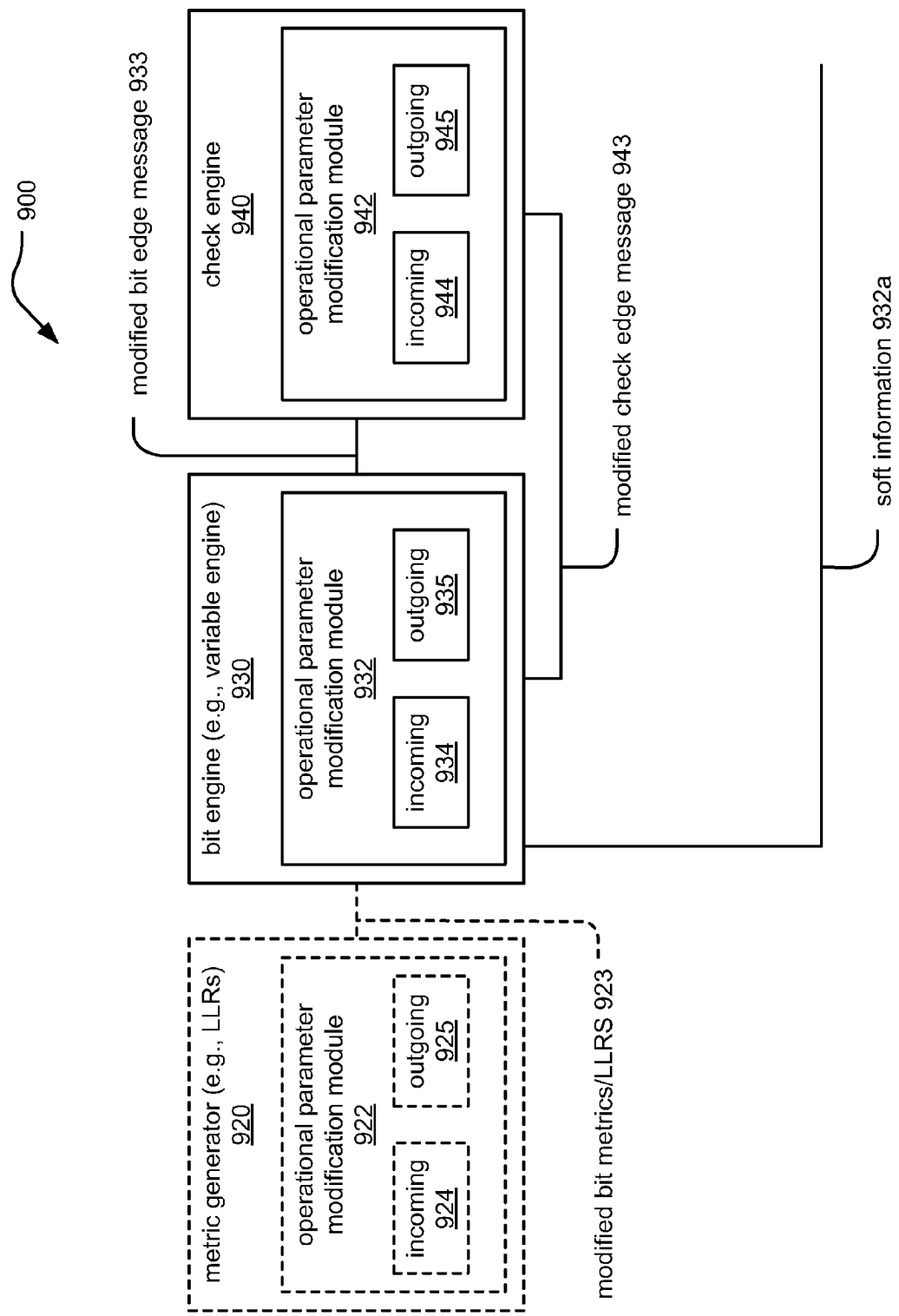

When comparing the embodiments of the FIG. 7, FIG. 8, and FIG. 9 to some of the previous embodiments, while no AFE, hard limiter, or syndrome calculator are explicitly depicted, the reader is reminded that such elements could clearly be included without departing from the scope and spirit of the invention.

Referring to the LDPC decoding functionality 700 of FIG. 7, this embodiment can also receive a continuous-time signal from a communication channel, and an AFE can be implemented to generate a discrete-time signal that is provided to a metric generator 720 that is operable to calculate bit metrics/LLRs 721 there from. An operational parameter modification module 722 can be implemented and operable to process the bit metrics/LLRs 721 and to modify those originally calculated bit metrics/LLRs 721 thereby generating modified bit metrics/LLRs 723. This modification performed by the operational parameter modification module 722 can be any modification in accordance with any of a variety of means including scaling, adding a first offset to and/or subtracting a second offset from, compressing, expanding, and/or some other means.

The modified bit metrics/LLRs 723 are then employed by a bit engine 730 to initialize the bit edge messages (e.g., as shown by reference numeral 731) that are employed when performing iterative decoding processing (e.g., as performed by the bit engine 730 and a check engine 740) of the LDPC coded signal.

Also, at the bit nodes, the bit engine 730 is operable to compute soft information of the bits (e.g., shown as soft information 732a) using the most recently updated bit edge messages (and/or modified bit edge messages).

Again, as with previous embodiments, it is common for multiple decoding iterations to be performed, so the initialized bit edge messages 731 are passed to an operational parameter modification module 732 can be implemented and operable to process the bit edge messages 731 and to modify those originally calculated bit edge messages 731 thereby generating modified bit edge messages 733. This modification performed by the operational parameter modification module 732 can be any modification in accordance with any of a variety of means including scaling, adding a first offset to and/or subtracting a second offset from, compressing, expanding, and/or some other means.

The modified bit edge messages 733 are passed to the check engine 740 where, during a first decoding iteration, the check engine 740 is operable to employ the initialized, modified bit edge messages 733 to update check edge messages. These updated check edge messages 741 are passed to an operational parameter modification module 742 can be implemented and operable to process the check edge messages 741 and to modify those originally calculated check edge messages 741 thereby generating modified check edge messages 743. This modification performed by the operational parameter modification module 742 can be any modification in accordance with any of a variety of means including scaling, adding a first offset to and/or subtracting a second offset from, compressing, expanding, and/or some other means.

Thereafter, the bit engine 730 is operable to receive the modified check edge messages 743 and to employ them to update the bit edge messages.

Also, the bit engine 730 is operable to employ the modified bit metrics/LLRs 732 when performing the updating of the bit edge messages in accordance with LDPC decoding. Also, these modified check edge messages 743 are then passed back to the bit nodes (e.g., to the bit engine 730) where the soft information 732a of the bits is calculated using the modified bit metrics/LLRs 723 and the current iteration values of the check edge messages. The iterative processing continues between the bit nodes and the check nodes according to the LDPC code bipartite graph that was employed to encode the signal that is being decoded.

These iterative decoding processing steps, performed by the bit node engine 730 and the check node engine 740, are repeated until a stopping criterion is met.

Soft information 732a can be generated within the bit engine 730 during each of the decoding iterations. In this embodiment, this soft information 732a may be provided to a hard limiter where hard decisions may be made, and that hard information may also be provided to a syndrome calculator that is operable to determine whether the syndromes of the LDPC code are all equal to zero.

Referring to the LDPC decoding functionality 800 of FIG. 8, this embodiment is somewhat similar to the previous embodiment of FIG. 7, with at lest one difference being that any "operational parameter modification module" is embedded within, or part of, another modules, functional block, etc.

This embodiment of FIG. 8 can also receive a continuous-time signal from a communication channel, and an AFE can be implemented to generate a discrete-time signal that is provided to a metric generator 820 that is operable to calculate bit metrics/LLRs there from. An operational parameter modification module 822, implemented as part of the metric generator 820, can be implemented and operable to process the bit metrics/LLRs and to modify those originally calculated bit metrics/LLRs thereby generating modified bit metrics/LLRs 823. This modification performed by the operational parameter modification module 822 can be any modification in accordance with any of a variety of means including scaling, adding a first offset to and/or subtracting a second offset from, compressing, expanding, and/or some other means.

The modified bit metrics/LLRs 823 are then employed by bit engine 830 to initialize bit edge messages and to generate modified bit edge messages 833 (using an embedded operational parameter modification module 832) there from that are employed when performing iterative decoding processing (e.g., as performed by the bit engine 830 and a check engine 840) of the LDPC coded signal. As with other embodiments, this modification performed by the operational parameter modification module 732 can be any modification in accordance with any of a variety of means Also, at the bit nodes, the bit engine 830 is operable to compute soft information of the bits (e.g., shown as soft information 832*a*) using the most recently updated bit edge messages (and/or modified bit edge messages).

Again, as with previous embodiments, it is common for multiple decoding iterations to be performed, so the initialized, modified bit edge messages 833 are passed to the check engine 840 where, during a first decoding iteration, the check engine 840 is operable to employ the initialized, modified bit edge messages 833 to update check edge messages. These updated check edge messages are then processed by an embedded operational parameter modification module 842 to process the check edge messages and to modify those originally calculated check edge messages thereby generating modified check edge messages 843. This modification performed by the operational parameter modification module 842 can be any modification in accordance with any of a variety of means including scaling, adding a first offset to and/or subtracting a second offset from, compressing, expanding, and/or some other means.

Thereafter, the bit engine 830 is operable to receive the modified check edge messages 843 and to employ them to update the bit edge messages.

Also, the bit engine 830 is operable to employ the modified bit metrics/LLRs 832 when performing the updating of the bit edge messages in accordance with LDPC decoding. Also, these modified check edge messages 843 are then passed back to the bit nodes (e.g., to the bit engine 830) where the soft information 832*a* of the bits is calculated using the modified bit metrics/LLRs 823 and the current iteration values of the check edge messages. The iterative processing continues between the bit nodes and the check nodes according to the LDPC code bipartite graph that was employed to encode the signal that is being decoded.

These iterative decoding processing steps, performed by the bit node engine 830 and the check node engine 840, are repeated until a stopping criterion is met.

Soft information 832*a* can be generated within the bit engine 830 during each of the decoding iterations. In this embodiment, this soft information 932*a*. may be provided to a hard limiter where hard decisions may be made, and that hard information may also be provided to a syndrome calculator that is operable to determine whether the syndromes of the LDPC code are all equal to zero.

The following embodiment of FIG. 9 is somewhat similar to the previous embodiment of FIG. 8, with at least one difference being that modification of incoming information (which can then be used) and subsequent modification of outgoing information (if such modification is desired) can be different. For example, information can be received by a processing module, and that information can be modified before using the modified form thereof to perform the appropriate step or information can also undergo modification before being transmits from the processing module.

Referring to the LDPC decoding functionality 900 of FIG. 9, this embodiment can also receive a continuous-time signal from a communication channel, and an AFE can be implemented to generate a discrete-time signal that is provided to a metric generator 920 that is operable to calculate bit metrics/LLRs there from. An operational parameter modification module 922, implemented as part of the metric generator 920, can be implemented and operable to process the bit metrics/LLRs and to modify those originally calculated bit metrics/LLRs thereby generating modified bit metrics/LLRs 923. This modification performed by the operational parameter modification module 922 can be any modification in accordance with any of a variety of means including scaling, adding a first offset to and/or subtracting a second offset from, compressing, expanding, and/or some other means. Moreover, the operational parameter modification module 922 can modify the received discrete-time signal initially in accordance with a first means before calculating the originally calculated bit metrics/LLRs in accordance with a first means (e.g., using the incoming modification 924), and then after calculating the originally calculated bit metrics/LLRs, the operational parameter modification module 922 can modify the originally calculated bit metrics/LLRs in accordance with a second means (e.g., using the outgoing modification 925) thereby generating the modified bit metrics/LLRs 923.

The modified bit metrics/LLRs 923 are then employed by bit engine 930 to initialize bit edge messages and to generate modified bit edge messages 933 (using an embedded operational parameter modification module 932) there from that are employed when performing iterative decoding processing (e.g., as performed by the bit engine 930 and a check engine 940) of the LDPC coded signal. As with other embodiments, this modification performed by the operational parameter modification module 932 can be any modification in accordance with any of a variety of means including scaling, adding a first offset to and/or subtracting a second offset from, compressing, expanding, and/or some other means. Moreover, the operational parameter modification module 932 can modify the received modified bit metrics/LLRs 923 (and/or received modified check edge messages 943) in accordance with a first (and/or second) means before computing soft information of the bits (e.g., shown as soft information 932*a*) or next updated bit edge messages or modified bit edge messages 933. As with other modules described above, the operational parameter modification module 932 can modify any received information in accordance with a first means (e.g., using the incoming modification 934), and then after calculating or updating information, the operational parameter modification module 932 can modify that information in accordance with a second means (e.g., using the outgoing modification 935) thereby generating outgoing information. The bit engine 930 is operable to provide modified bit edge messages 933 to the check engine 940.

Also, at the bit nodes, the bit engine 930 is operable to compute soft information of the bits (e.g., shown as soft information 932*a*) using the most recently updated bit edge messages (and/or modified bit edge messages).

Again, as with previous embodiments, it is common for multiple decoding iterations to be performed, so the initialized, modified bit edge messages 933 are passed to the check engine 940 where, during a first decoding iteration, the check engine 940 is operable to employ the initialized, modified bit edge messages 933 to update check edge messages. These updated check edge messages are then processed by an embedded operational parameter modification module 942 to process the check edge messages and to modify those originally calculated check edge messages thereby generating modified check edge messages 943. This modification performed by the operational parameter modification module 942 can be any modification in accordance with any of a variety of means including scaling, adding a first offset to and/or subtracting a second offset from, compressing, expanding, and/or some other means. As with other modules described above, the operational parameter modification module 942 can modify received information in accordance with a first means (e.g., using the incoming modification 944), and then after calculating or updating information, the operational parameter modification module 942 can modify that information in accordance with a second means (e.g., using the outgoing modification 945) thereby generating outgoing information. The check engine 930 is operable to provide modified check edge messages 943 to the bit engine 930. Thereafter, the bit engine 930 is operable to receive the modified check edge messages 943 and to employ them to update the bit edge messages.

Also, the bit engine 930 is operable to employ the modified bit metrics/LLRs 932 when performing the updating of the bit edge messages in accordance with LDPC decoding. Also, these modified check edge messages 943 are then passed back to the bit nodes (e.g., to the bit engine 830) where the soft information 932*a* of the bits is calculated using the modified bit metrics/LLRs 823 and the current iteration values of the check edge messages. The iterative processing continues between the bit nodes and the check nodes according to the LDPC code bipartite graph that was employed to encode the signal that is being decoded.

These iterative decoding processing steps, performed by the bit node engine 930 and the check node engine 940, are repeated until a stopping criterion is met.

Soft information 932*a* can be generated within the bit engine 930 during each of the decoding iterations. In this embodiment, this soft information 932*a*. may be provided to a hard limiter where hard decisions may be made, and that hard information may also be provided to a syndrome calculator that is operable to determine whether the syndromes of the LDPC code are all equal to zero.

Figure 10:
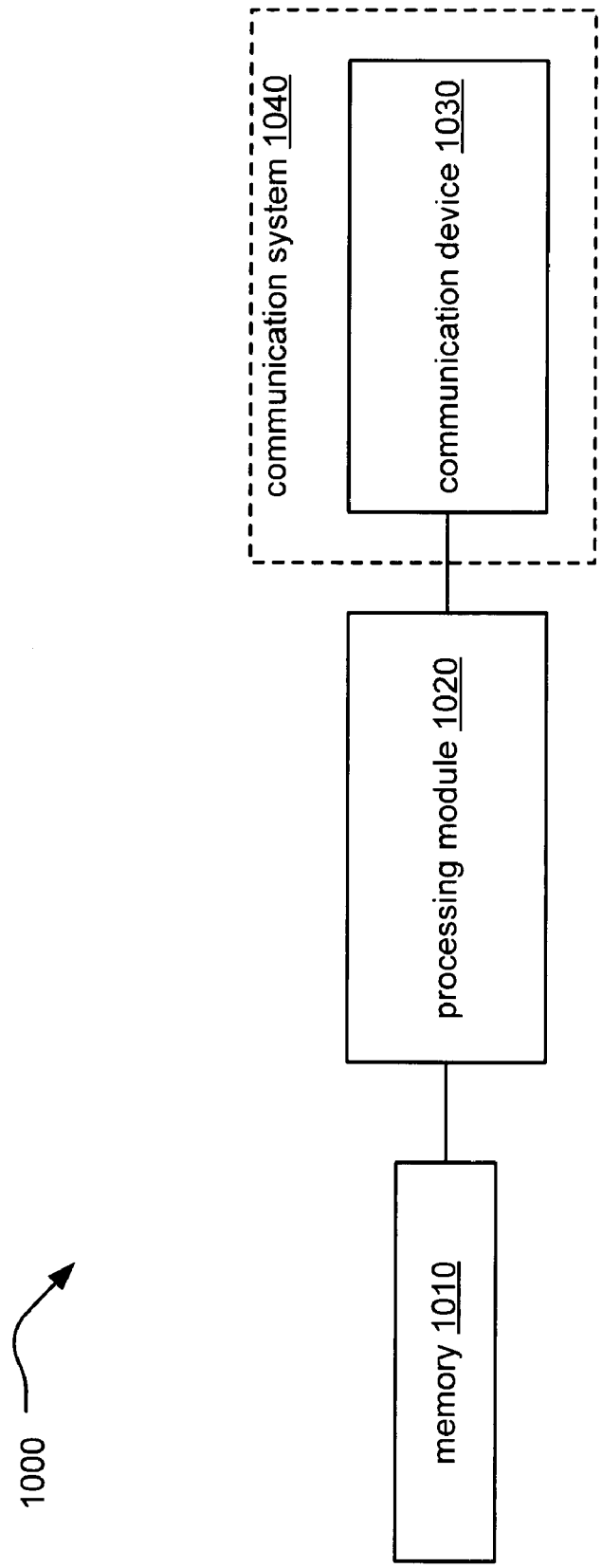
FIG. 10 illustrates an embodiment of an apparatus that is operable to perform LDPC decoding processing.

FIG. 10 illustrates an embodiment of an apparatus 1000 that is operable to perform LDPC decoding processing. The apparatus 1000 includes a processing module 1020, and a memory 1010. The memory 1010 is coupled to the processing module, and the memory 1010 is operable to store operational instructions that enable the processing module 1020 to perform a variety of functions. The processing module 1020 is operable to perform and/or direct the manner in which LDPC decoding processing is to be performed in accordance with any embodiment described herein, or any equivalent thereof.

The processing module 1020 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 1010 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 1020 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which the LDPC decoding processing is to be performed (e.g., which means of operational parameter modification is to be performed, to which operational parameters such operational parameter modification is to be performed, whether different operational parameter modification is to be performed for different decoding iterations, etc.) can be provided from the apparatus 1000 to a communication system 1040 that is operable to employ and perform LDPC coding using a desired LDPC code. For example, information corresponding to the LDPC code being used (e.g., the parity check matrix of the LDPC code) can also be provided from the processing module 1020 to any of a variety of communication devices 1030 implemented within the communication system 1040 as well. In addition, the manner in which such LDPC decoding is to be performed within any of a variety of communication devices 1030 implemented within the communication system 1040 can also be provided from the processing module 1020.

If desired, the apparatus 1020 can be designed to generate multiple means of performing LDPC decoding in accordance with multiple needs and/or desires as well. In some embodiments, the processing module 1020 can selectively provide different information (e.g., corresponding to different LDPC codes, different operational parameter modification, etc.) to different communication devices and/or communication systems. That way, different communication links between different communication devices can employ different LDPC codes and/or means by which to perform LDPC decoding (e.g., employing different operational modification). Clearly, the processing module 1020 can also provide the same information to each of different communication devices and/or communication systems as well without departing from the scope and spirit of the invention.

Figure 11:
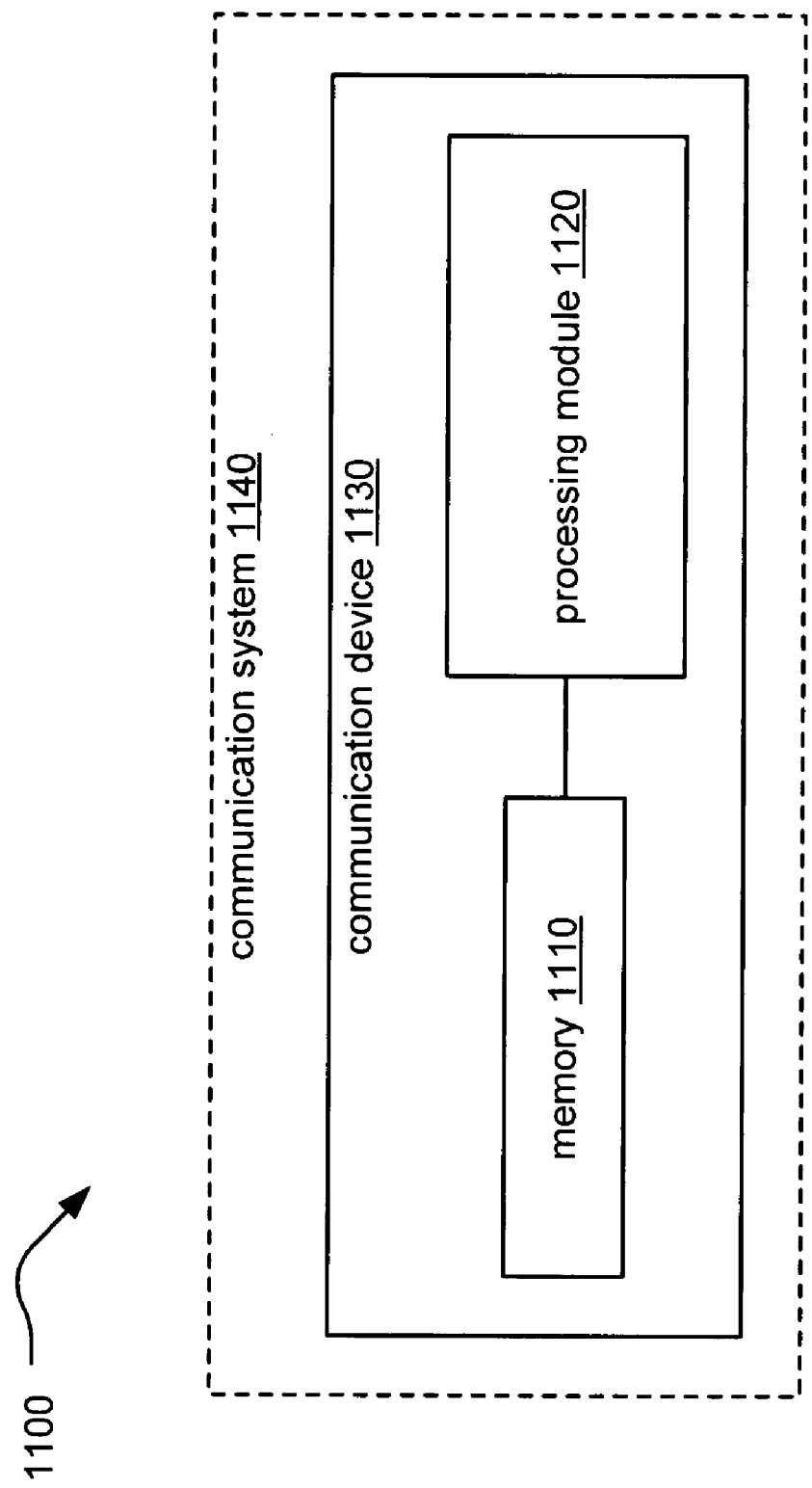
FIG. 11 illustrates an alternative embodiment of an apparatus that is operable to perform LDPC decoding processing.

FIG. 11 illustrates an alternative embodiment of an apparatus 1100 that is operable to perform LDPC decoding processing. The apparatus 1100 includes a processing module 1120, and a memory 1110. The memory 1110 is coupled to the processing module, and the memory 1110 is operable to store operational instructions that enable the processing module 1120 to perform a variety of functions. The processing module 1120 (serviced by the memory 1120) can be implemented as an apparatus capable to perform any of the functionality of any of the various modules and/or functional blocks described herein. For example, the processing module 1120 (serviced by the memory 1120) can be implemented as an apparatus capable to perform and/or direct the manner in which LDPC decoding processing is to be performed in accordance with any embodiment described herein, or any equivalent thereof.

The processing module 1120 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 1110 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 1120 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 1100 can be any of a variety of communication devices 1130, or any part or portion of any such communication device 1130. Any such communication device that includes the processing module 1120 and/or memory 1110 can be implemented within any of a variety of communication systems 1140 as well. It is also noted that various embodiments of LDPC decoding processing and/or operational parameter modification in accordance with LDPC decoding processing as presented herein, and equivalents thereof, may be applied to many types of communication systems and/or communication devices.

Figure 12:
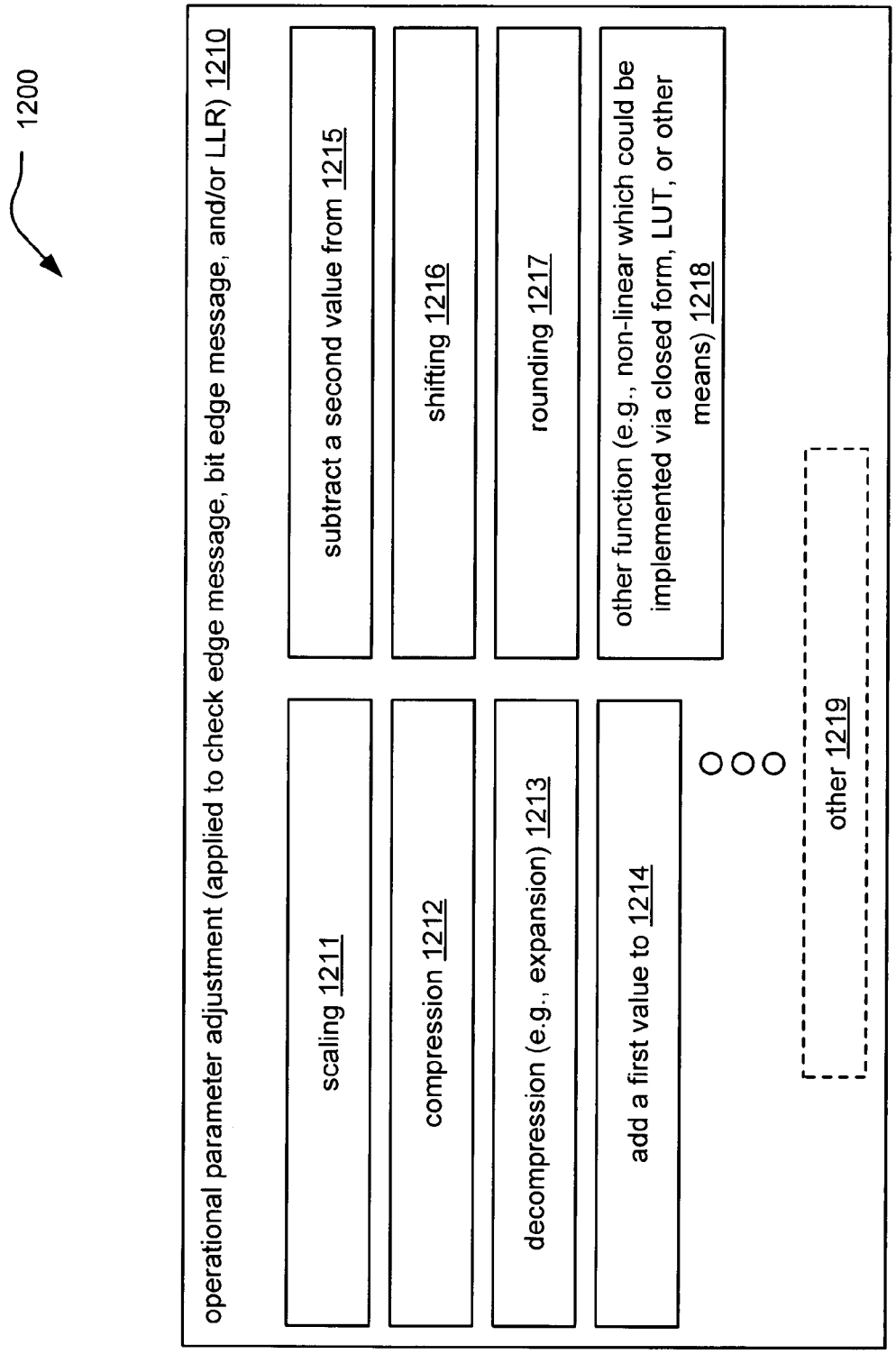
FIG. 12 illustrates an embodiment of some operational parameters that may be employed in accordance with LDPC decoding.

FIG. 12 illustrates an embodiment of some operational parameters 1200 that may be employed in accordance with LDPC decoding. As mentioned above with respect to other embodiments, any one or more of bit metrics/LLRs, check edge messages, bit edge messages, or other operational parameters employed in accordance with LDPC decoding processing can undergo modification before, during, and/or after the LDPC decoding processing. For example, operational parameter adjustment, as shown by reference numeral 1210, can be applied to any one or more of bit metrics/LLRs, check edge messages, and/or bit edge messages. This modification can be effectuated using scaling 1211, compression 1212, decompression (e.g., expansion) 1213, adding a first value to 1214, subtracting a second value from 1215, shifting a bit edge message by a first amount and/or shifting a check edge message by a second amount, respectively, 1216, rounding a bit edge message and/or a check edge message up or down 1217, employing some other function 1218 (e.g., such as a non-linear functions which could be implemented via a closed form expression, a look-up table (LUT), a combination thereof, or some other means), and/or any other modification 1219.

Many of the operations performed herein can be performed in the finite precision domain (e.g., when operating on digital signals). In this context, the shift operations can be viewed as performing a cyclic shift in some embodiments (e.g., the vector 1100 could become 0110 after undergoing a cyclic shift). The rounding 1217 can be performed up or down to any desired degree of precision (e.g., 1.65 could be rounded up to 1.7 or 2.0 or rounded down to 1.6 or 1.0 in alternative embodiments). Moreover, the other function 1218 (e.g., a non-linear function) can be any of a variety of desired functions to modify one or both of $Medge_c$ (a check edge message) and/or $Medge_b$ (a bit edge message) (e.g., $f(Medge_c)=(Medge_c)^2$, $f(Medge_b)=(Medge_b)^2$, $f(Medge_b)=e^{(Medge_b)}$, $f(Medge_b)=2^{(Medge_b)}$, etc.).

Any one of these means of modification, or any combination thereof, can be applied to any of the operational parameters employed in accordance with LDPC decoding processing.

Figure 13:
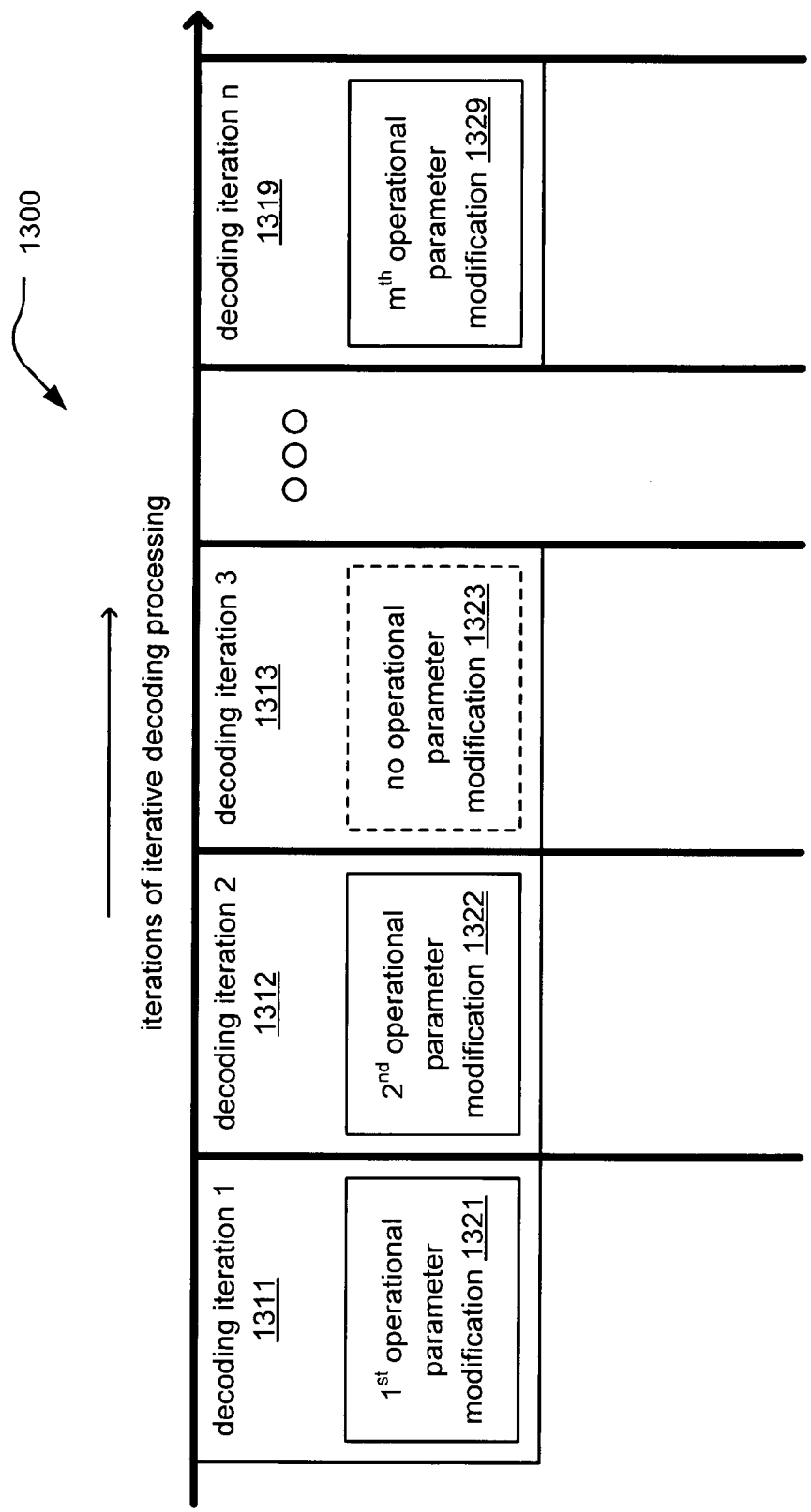
FIG. 13 illustrates an embodiment of operational parameter modification as a function of decoding iteration in accordance with LDPC decoding.

FIG. 13 illustrates an embodiment of operational parameter modification 1300 as a function of decoding iteration in accordance with LDPC decoding. During a decoding iteration 1 (shown by reference numeral 1311), a $1^{st}$ operational parameter modification (shown by reference numeral 1321) is applied to one or more of the operational parameters employed in accordance with LDPC decoding processing).

During a decoding iteration 2 (shown by reference numeral 1312), a $2^{nd}$ operational parameter modification (shown by reference numeral 1322) is applied to one or more of the operational parameters employed in accordance with LDPC decoding processing.

During a decoding iteration 3 (shown by reference numeral 1313), there is no operational parameter modification (shown by reference numeral 1323) applied to any of the operational parameters employed in accordance with LDPC decoding processing).

The iterative decoding processing continues for additional decoding iterations, and then during a decoding iteration n (shown by reference numeral 1319), an $m^{th}$ operational parameter modification (shown by reference numeral 1329) is applied to one or more of the operational parameters employed in accordance with LDPC decoding processing).

FIG. 14, FIG. 15, FIG. 16, FIG. 17, and FIG. 18 illustrate alternative embodiments of operational parameter modification as a function of decoding iteration in accordance with LDPC decoding.

Figure 14:
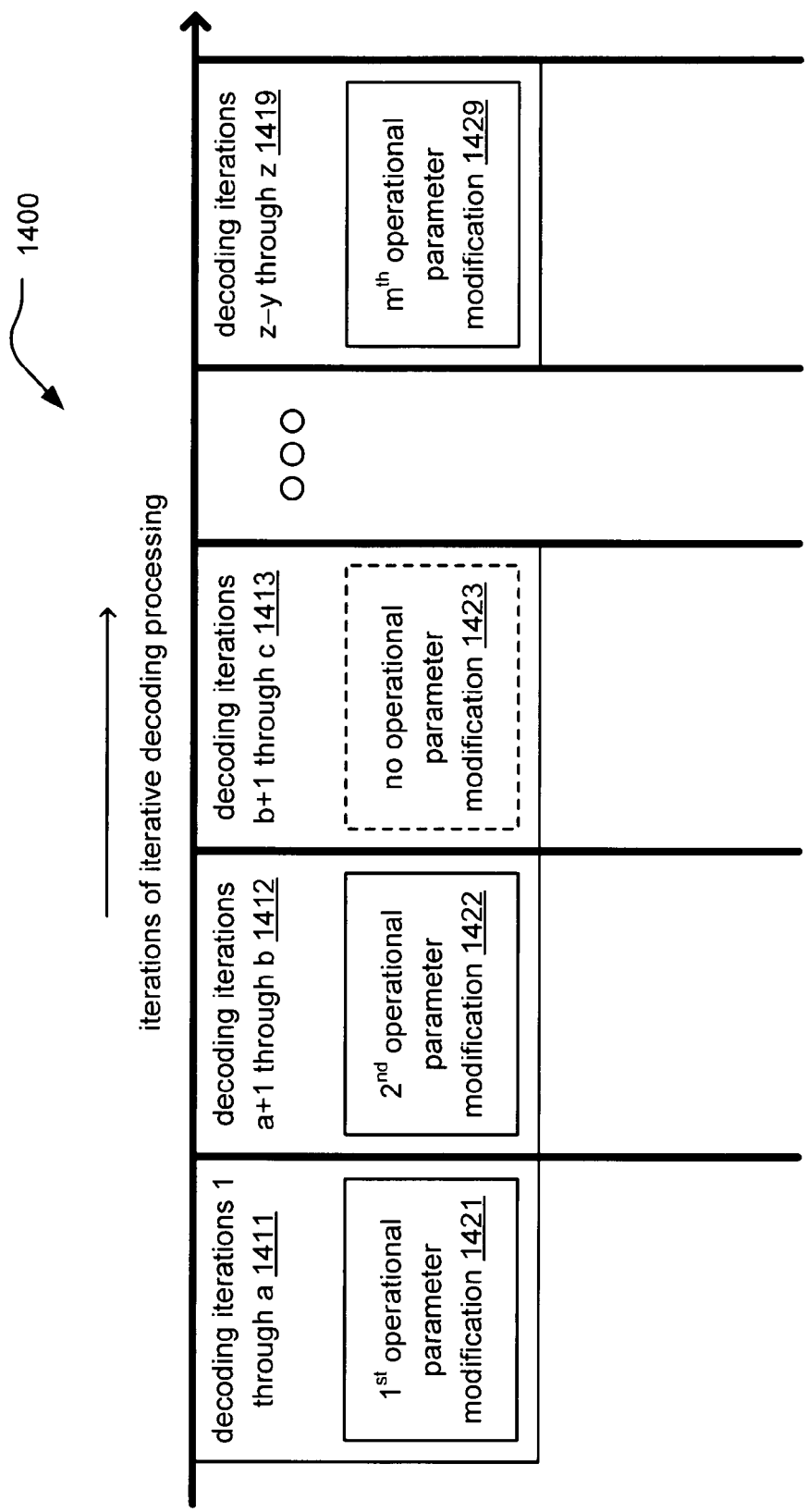
FIG. 14, FIG. 15, FIG. 16, FIG. 17, and FIG. 18 illustrate alternative embodiments of operational parameter modification as a function of decoding iteration in accordance with LDPC decoding.

Referring to the embodiment 1400 of FIG. 14, during a first plurality of decoding iterations (e.g., iterations 1 through a, as shown by reference numeral 1411), a $1^{st}$ operational parameter modification (shown by reference numeral 1421) is applied to one or more of the operational parameters employed in accordance with LDPC decoding processing).

During a second plurality of decoding iterations (e.g., iterations a+1 through b, as shown by reference numeral 1412), a $2^{nd}$ operational parameter modification (shown by reference numeral 1422) is applied to one or more of the operational parameters employed in accordance with LDPC decoding processing).

During a third plurality of decoding iterations (e.g., iterations b+1 through c, as shown by reference numeral 1413), there is no operational parameter modification (shown by reference numeral 1423) applied to any of the operational parameters employed in accordance with LDPC decoding processing.

The iterative decoding processing continues for additional decoding iterations, and then during a final plurality of decoding iterations (e.g., decoding iteration z−y through z, as shown by reference numeral 1419), an $m^{th}$ operational parameter modification (shown by reference numeral 1429) is applied to one or more of the operational parameters employed in accordance with LDPC decoding processing).

While the embodiments of the FIG. 13 and the FIG. 14 have generally described some possible manners by which operational parameter modification can be performed, the following embodiment depicts a more specific embodiment to assist the reader's understanding. The operations of the embodiment of the FIG. 15 could also be applied to embodiments that applied such different forms of operational parameter modification during each of a first plurality of decoding iterations, a second plurality of decoding iterations, and so on as well without departing from the scope and spirit of the invention.

Figure 15:
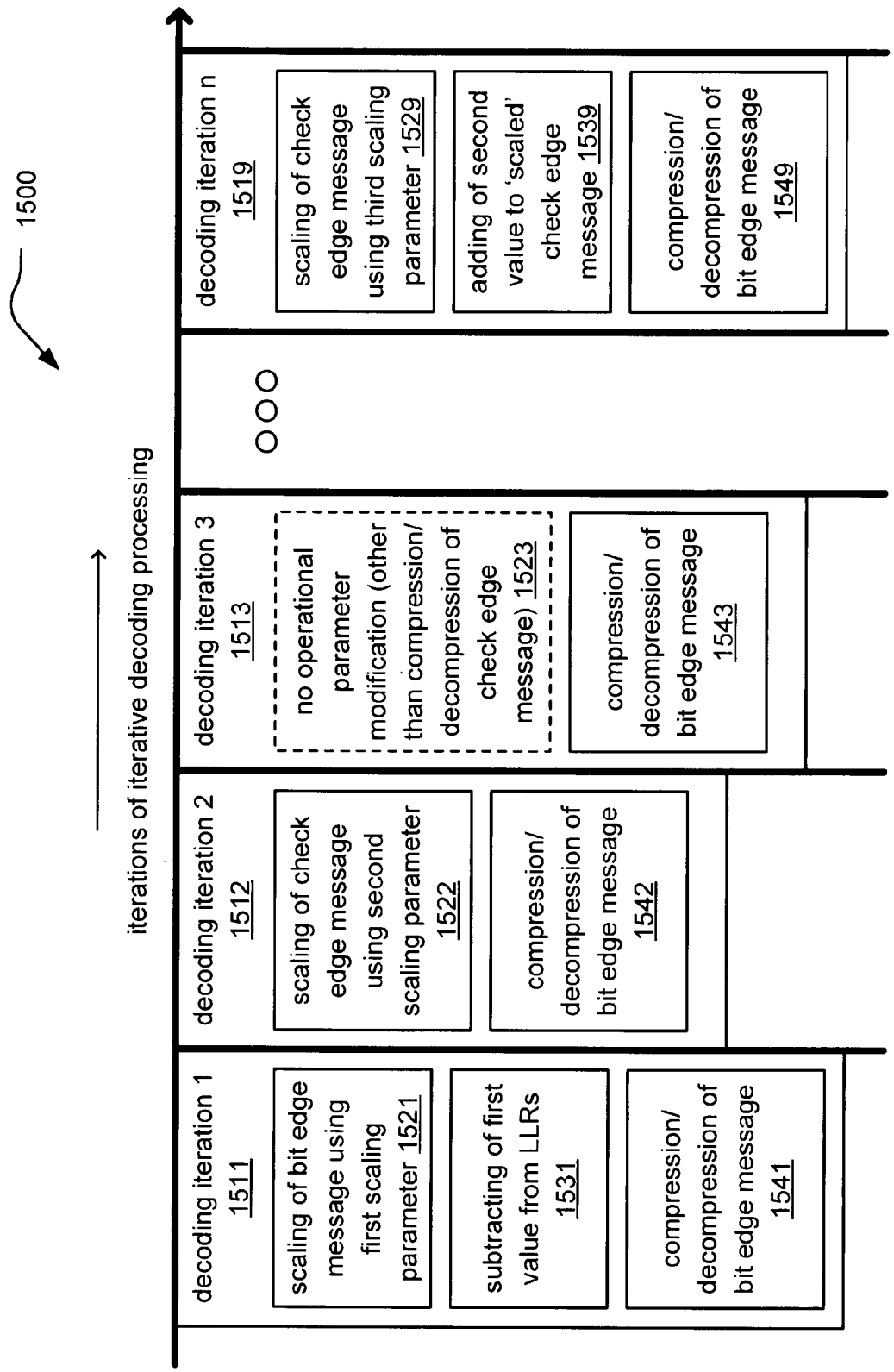

Referring to the embodiment 1500 of FIG. 15, during a decoding iteration 1 (shown by reference numeral 1511), bit edge messages are scaled using a first scaling parameter as shown by reference numeral 1521. Also, LLRs are modified by subtracting a first value there from as shown by a reference numeral 1531. Also, bit edge messages undergo compression (before being passed for use in check node processing) and then undergo decompression (e.g., expansion) to recover those bit edge messages within the check node processing, as shown by reference numeral 1541. This means of compression/decompression (e.g., expansion) is a means by which less information need to be transferred for each bit edge message thereby assisting is less memory management requirements, processing consumption, etc.

During a decoding iteration 2 (shown by reference numeral 1512), the check edge messages are scaled using a second scaling parameter as shown by reference numeral 1522. Also, bit edge messages undergo compression (before being passed for use in check node processing) and then undergo decompression (e.g., expansion) to recover those bit edge messages within the check node processing, as shown by reference numeral 1542.

During a decoding iteration 3 (shown by reference numeral 1513), there is no operational parameter modification (shown by reference numeral 1523) applied to any of the operational parameters employed in accordance with LDPC decoding processing, other than the fact that the bit edge messages undergo compression (before being passed for use in check node processing) and then undergo decompression (e.g., expansion) to recover those bit edge messages within the check node processing, as shown by reference numeral 1543.

The iterative decoding processing continues for additional decoding iterations, and then during a decoding iteration n (shown by reference numeral 1519), the check edge messages are scaled using a third scaling parameter, as shown by reference numeral 1529. Also, the 'scaled' check edge messages of this iteration then also undergo operational parameter modification, in that, a second value is added to the 'scaled' check edge messages, as shown by reference numeral 1539. The bit edge messages undergo compression (before being passed for use in check node processing) and then undergo decompression (e.g., expansion) to recover those bit edge messages within the check node processing, as shown by reference numeral 1549.

Figure 16:
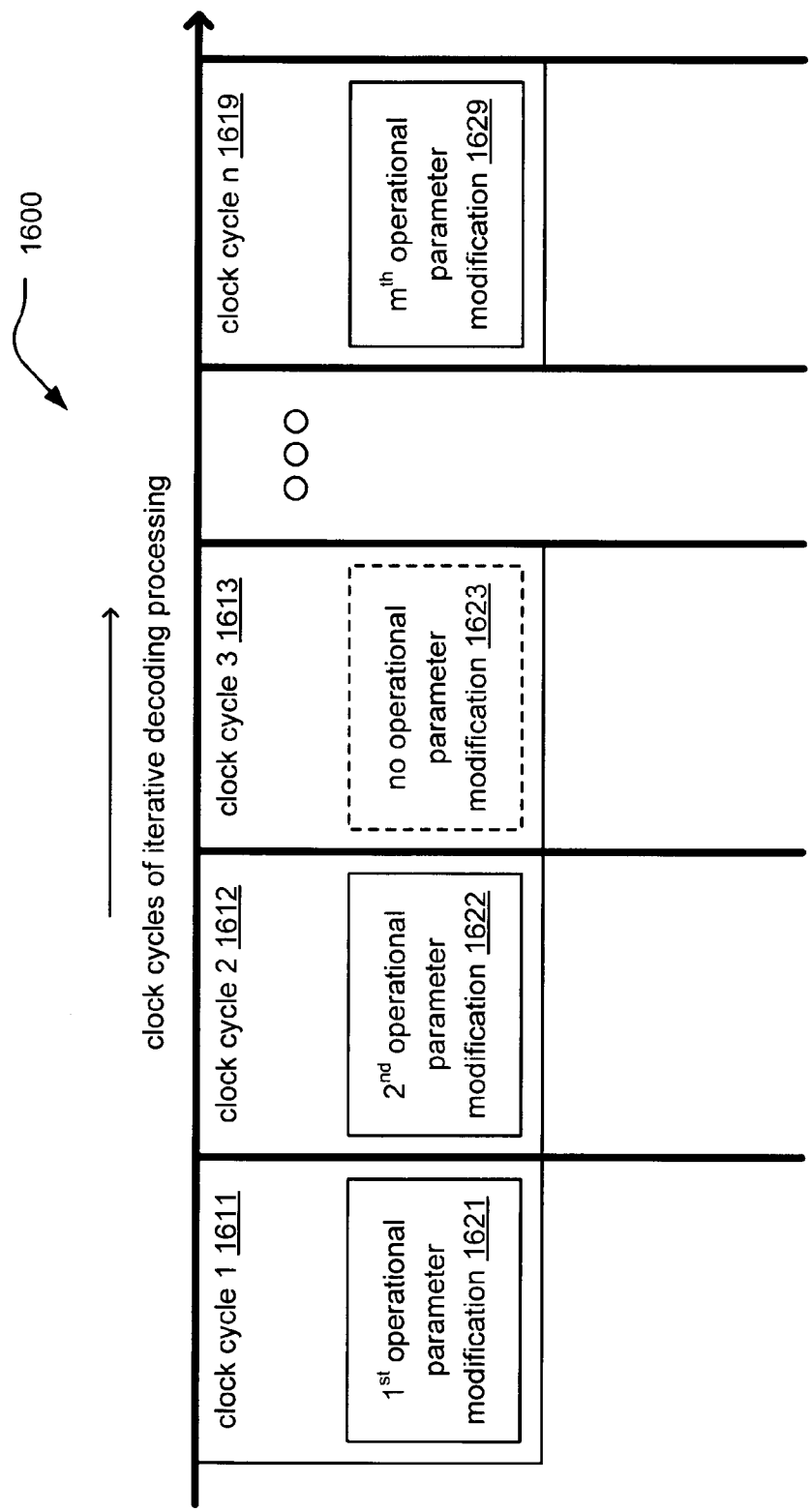

Referring to the embodiment 1600 of FIG. 16, operational parameter modification is performed on a clock cycle basis (e.g., as opposed to a decoding iteration basis or a plurality of decoding iterations basis as described above in some other embodiments). During a clock cycle 1 (shown by reference numeral 1611), a $1^{st}$ operational parameter modification (shown by reference numeral 1621) is applied to one or more of the operational parameters employed in accordance with LDPC decoding processing).

During a clock cycle 2 (shown by reference numeral 1612), a $2^{nd}$ operational parameter modification (shown by reference numeral 1622) is applied to one or more of the operational parameters employed in accordance with LDPC decoding processing.

During a clock cycle 3 (shown by reference numeral 1613), there is no operational parameter modification (shown by reference numeral 1623) applied to any of the operational parameters employed in accordance with LDPC decoding processing).

The iterative decoding processing continues for additional decoding iterations, and then during a clock cycle n (shown by reference numeral 1619), an $m^{th}$ operational parameter modification (shown by reference numeral 1629) is applied to one or more of the operational parameters employed in accordance with LDPC decoding processing).

Figure 17:
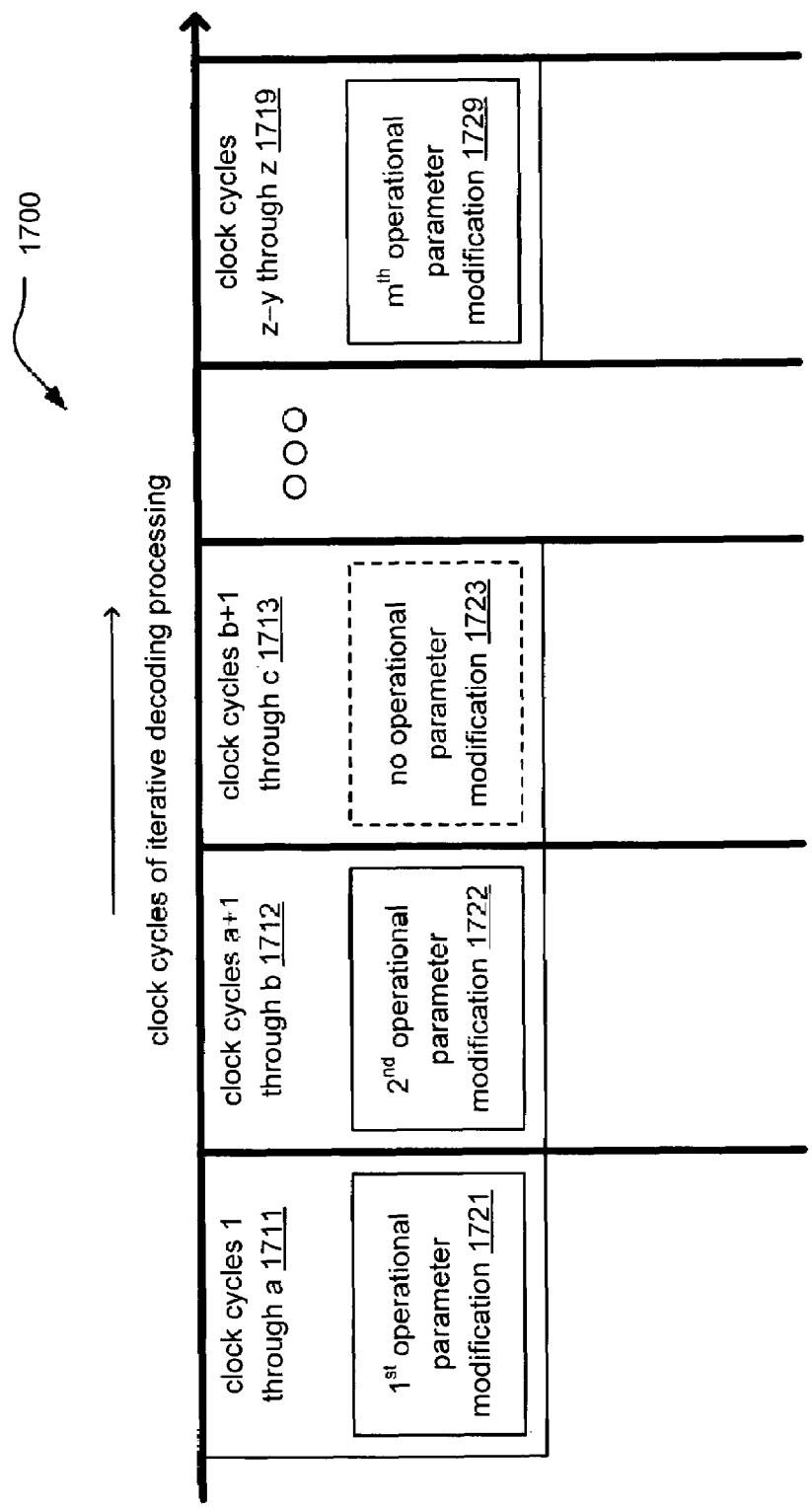

Referring to the embodiment 1700 of FIG. 17, operational parameter modification is performed on plurality of clock cycles basis (e.g., as opposed to a decoding iteration basis, a plurality of decoding iterations basis, or merely a single clock cycle basis as described above in some other embodiments).

During a first plurality of clock cycles (e.g., clock cycles 1 through a, as shown by reference numeral 1711), a $1^{st}$ operational parameter modification (shown by reference numeral 1721) is applied to one or more of the operational parameters employed in accordance with LDPC decoding processing).

During a second plurality of clock cycles (e.g., clock cycles a+1 through b, as shown by reference numeral 1712), a $2^{nd}$ operational parameter modification (shown by reference numeral 1722) is applied to one or more of the operational parameters employed in accordance with LDPC decoding processing).

During a third plurality of clock cycles (e.g., clock cycles b+1 through c, as shown by reference numeral 1713), there is no operational parameter modification (shown by reference numeral 1723) applied to any of the operational parameters employed in accordance with LDPC decoding processing.

The iterative decoding processing continues for additional decoding iterations, and then during a final plurality of clock cycles (e.g., clock cycles z–y through z, as shown by reference numeral 1719), an $m^{th}$ operational parameter modification (shown by reference numeral 1729) is applied to one or more of the operational parameters employed in accordance with LDPC decoding processing).

It also is noted that the "clock cycle" related variables depicted as "a, b, c, y, and z" in FIG. 17 may be actually different values than the "iteration" related variables depicted as "a, b, c, y, and z" in FIG. 14.

Figure 18:
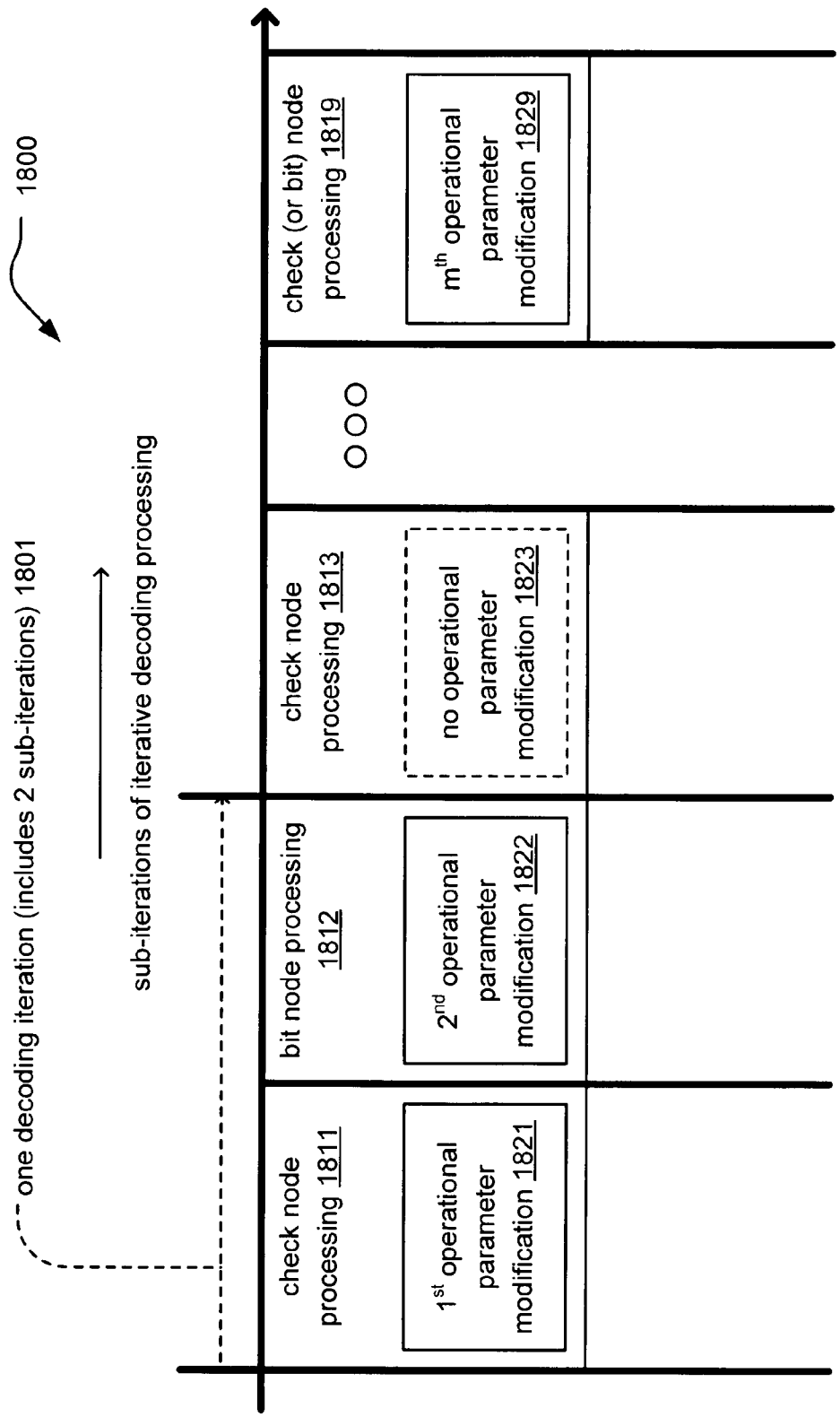

Referring to the embodiment 1800 of FIG. 18, operational parameter modification is performed on sub-iteration basis. In this context, a sub-iteration can be viewed as either check node processing or bit node processing (e.g., variable node processing). During a first sub-iteration (e.g., a check node processing sub-iteration, as shown by reference numeral 1811), a $1^{st}$ operational parameter modification (shown by reference numeral 1821) is applied to one or more of the operational parameters employed in accordance with LDPC decoding processing).

During a second sub-iteration (e.g., a bit node processing sub-iteration, as shown by reference numeral 1812), a $2^{nd}$ operational parameter modification (shown by reference numeral 1822) is applied to one or more of the operational parameters employed in accordance with LDPC decoding processing).

It is noted here that the first sub-iteration (check node processing 1811) and the second sub-iteration (bit node processing 1812) form one decoding iteration 1801.

During a third sub-iteration (e.g., a check node processing sub-iteration, as shown by reference numeral 1813), there is no operational parameter modification (shown by reference numeral 1823) applied to any of the operational parameters employed in accordance with LDPC decoding processing.

The iterative decoding processing continues for additional decoding iterations, and then during a final sub-iteration (e.g., a check node processing sub-iteration if a bit node processing sub-iteration was just previously performed (or a bit node processing sub-iteration if a check node processing sub-iteration was just previously performed), as shown by reference numeral 1819), an $m^{th}$ operational parameter modification (shown by reference numeral 1829) is applied to one or more of the operational parameters employed in accordance with LDPC decoding processing).

Figure 19:
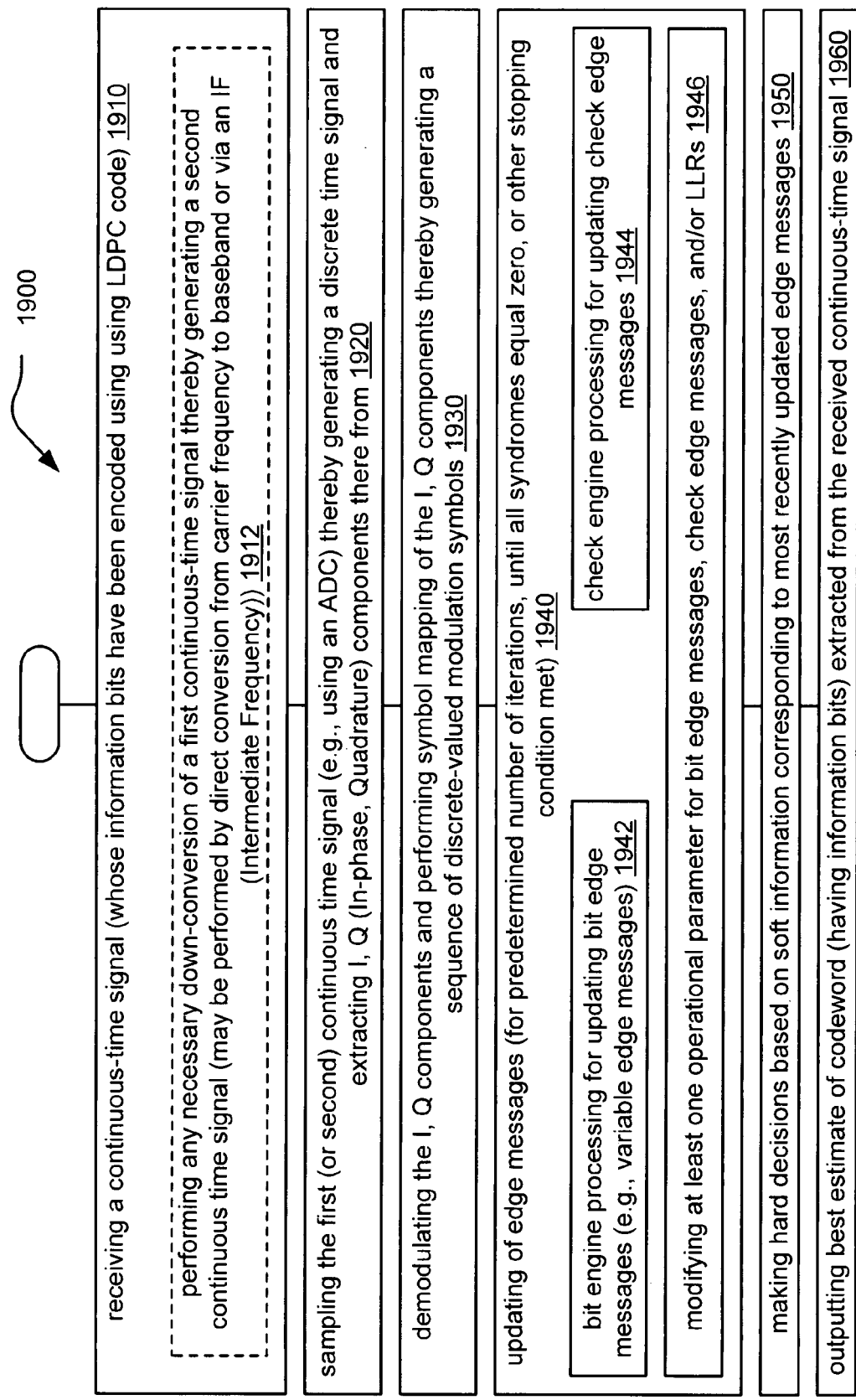
FIG. 19 illustrates an embodiment of a method for processing an LDPC coded signal that involves operational parameter modification.

FIG. 19 illustrates an embodiment of a method 1900 for processing an LDPC coded signal that involves operational parameter modification. The method 1900 initially involves receiving a continuous-time signal, as shown in a block 1910. This receiving and processing of the continuous-time signal may also involve performing any necessary down-conversion of a first continuous-time signal thereby generating a second continuous-time signal, as shown in a block 1912. Any frequency conversion that may need to be performed may possibly be performed by direct conversion from carrier frequency to a baseband frequency. This frequency conversion may alternatively be performed via an IF (Intermediate Frequency). In whichever embodiment, the received continuous-time signal is typically brought down in frequency to a baseband continuous-time signal when performing this method. Also, certain types of gain adjustment/gain control may be applied to the received continuous-time signal.

The method 1900 also involves sampling the first (or second) continuous-time signal thereby generating a discrete-time signal and extracting I, Q (In-phase, Quadrature) components there from, as shown in a block 1920. This sampling may be performed using an ADC (Analog to Digital Converter) or equivalent means to generate the discrete-time signal from the appropriately down-converted (and potentially also filtered, gain adjusted, etc.) received continuous-time signal. The I, Q components of the individual samples of the discrete time signal are also extracted within this step. The method 1900 then involves demodulating the I, Q components and can involve performing symbol mapping of the I, Q components (e.g., to a constellation shape having a mapping of the constellation points therein) thereby generating a sequence of discrete-valued modulation symbols, as shown in a block 1930.

The next step of the method 1900 involves performing updating of edge messages until a stopping condition is met (e.g., for a predetermined number of iterations, until all syndromes are equal to zero, or until some other stopping criterion is met), as shown in a block 1940. This step may be viewed as performing the LDPC decoding in accordance with any of the various embodiments described above. This LDPC decoding generally involves bit engine processing for updating bit edge messages (e.g., variable edge messages) (as shown in a block 1942) as well as check engine processing for updating check edge messages (as shown in a block 1944). In addition, the LDPC decoding of the method 1900 also involves modifying at least one operational parameter for bit edge messages, check edge messages, and/or LLRs, as shown by reference numeral 1946. This modification of the block 1946 can be any modification in accordance with any of a variety of means including scaling, adding a first offset to and/or subtracting a second offset from, compressing, expanding, and/or some other means.

After the stopping condition has been met, the method 1900 involves making hard decisions based on soft information corresponding to most recently updated bit edge messages, as shown in a block 1950. The method 1900 ultimately involves outputting a best estimate of the LDPC coded bits (LDPC codeword, or LDPC code block) (that includes the information bits) that has been extracted from the received continuous-time signal, as shown in a block 1960.

In this disclosure, it is noted that once a low density parity check matrix, H, is available for use in decoding processing at a receiving end of a communication channel, the corresponding generator matrix, G, of the LDPC code may be generated straightforwardly from the low density parity check matrix, H. Having this information allows a designer to implement the encoding processing (using the generator matrix, G, of the LDPC code) at the transmitter end of the communication channel and also for decoding processing (using the low density parity check matrix, H, of the LDPC code) at the receiver end of the communication channel. In fact, it is common in the art that an LDPC code is defined directly from the low density parity check matrix, H. Stated another way, the low density parity check matrix, H, includes all of the necessary information to define the LDPC code.

Figure 20:
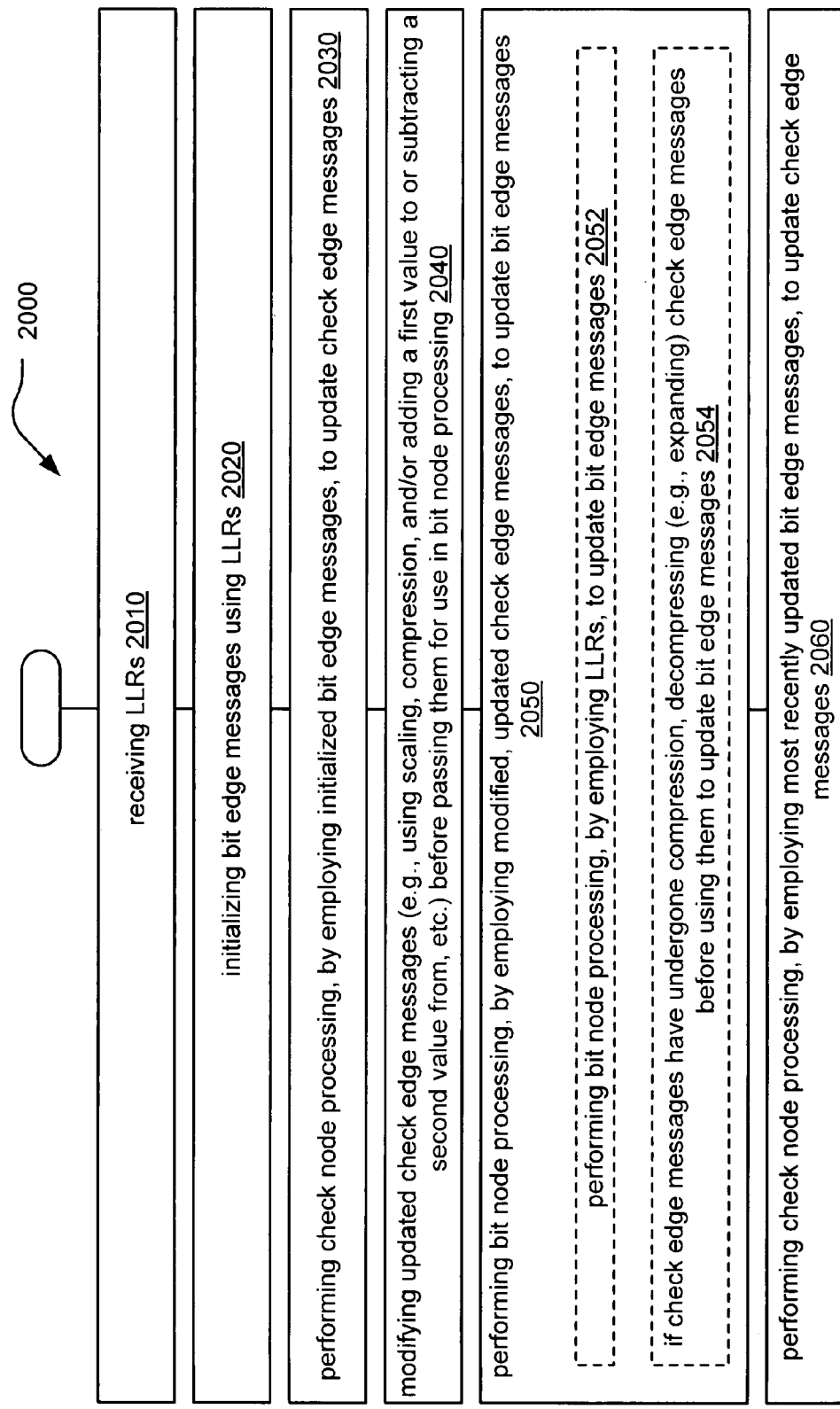
FIG. 20, FIG. 21, and FIG. 22 illustrate alternative embodiments of a method for processing an LDPC coded signal that involves operational parameter modification.
Figure 21:
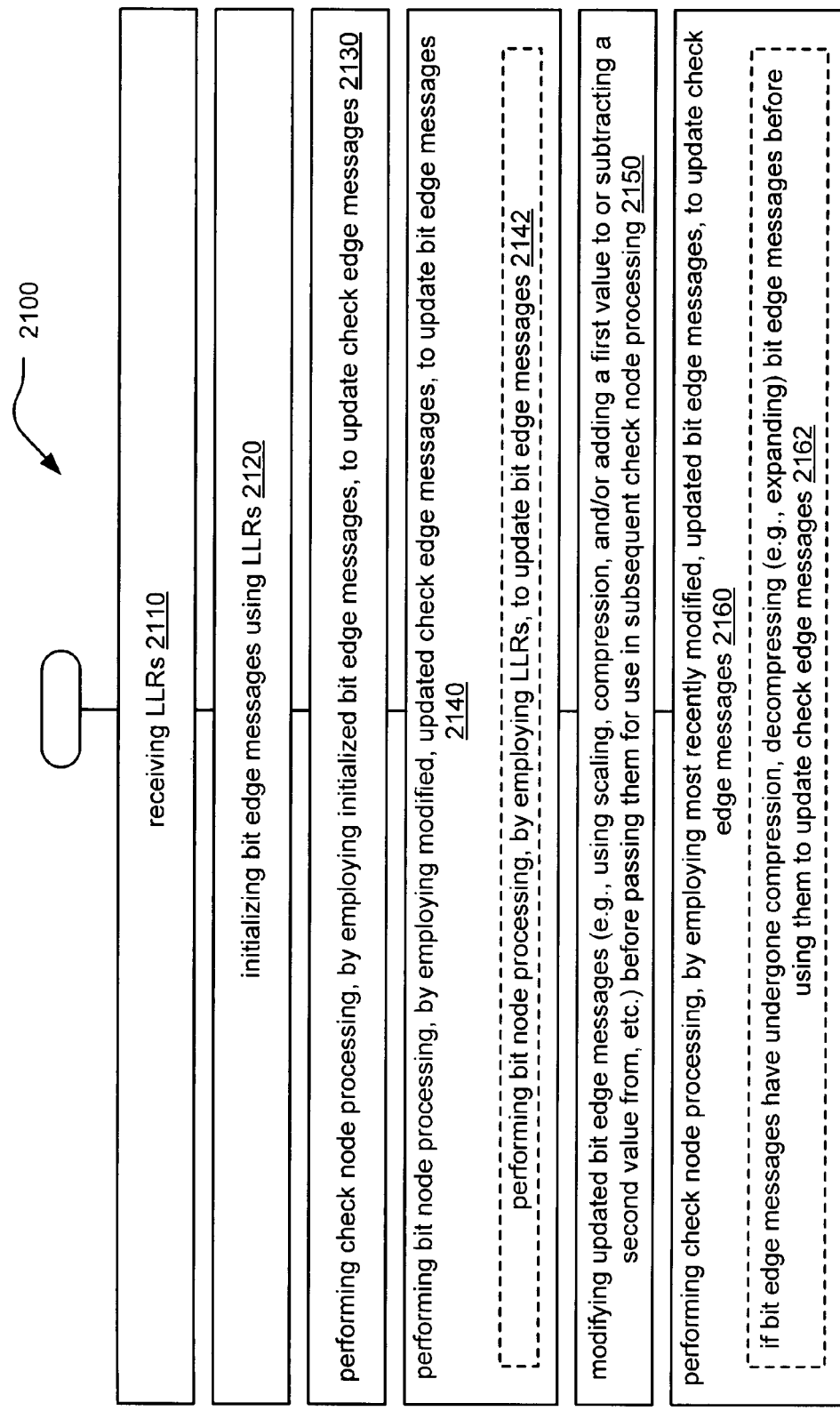
Figure 22:
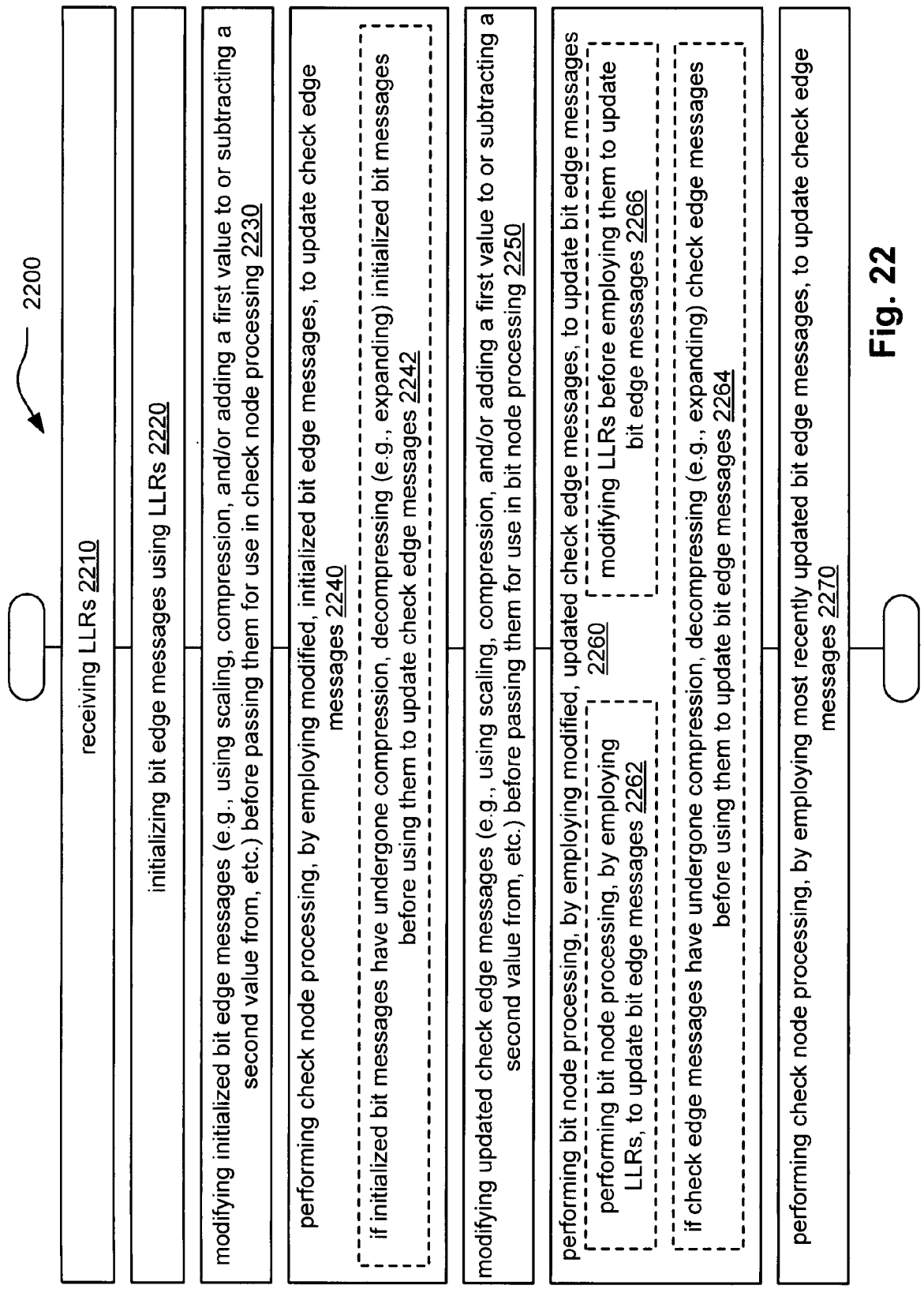

FIG. 20, FIG. 21, and FIG. 22 illustrate alternative embodiments of a method for processing an LDPC coded signal that involves operational parameter modification.

Referring to the method 2000 of the FIG. 20, the method 2000 operates by receiving LLRs, as shown in a block 2010. Then, the method 2000 operates by initializing bit edge messages using the LLRs, as shown in a block 2020. The method 2000 operates by performing check node processing, by employing the initialized bit edge messages, to update check edge messages, as shown in a block 2030.

The method 2000 operates by modifying the updated check edge messages (e.g., using scaling compression, and/or adding a first value to or subtracting a second value from, etc.) before passing the modified, updated check edge messages for use in bit node processing, as shown in a block 2040.

The method 2000 operates by performing bit node processing, by employing the modified, updated check edge messages, to update bit edge messages, as shown in a block 2050. This can also involve performing bit node processing, by employing LLRs, to update bit edge messages, as shown in a block 2052. Moreover, if the check edge messages have undergone compression during the modification in the block 2040, then the method 2000 also involves decompressing (e.g., expanding) those check edge messages before using them to update bit edge messages, as shown in a block 2054.

The method 2000 also operates by performing check node processing, by employing most recently updated bit edge messages, to update check edge messages, as shown in a block 2060.

Referring to the method 2100 of the FIG. 21, the method 2100 operates by receiving LLRs, as shown in a block 2110. Then, the method 2100 operates by initializing bit edge messages using the LLRs, as shown in a block 2120. The method 2100 operates by performing check node processing, by employing the initialized bit edge messages, to update check edge messages, as shown in a block 2130.

The method 2100 also operates by performing bit node processing, by employing the updated check edge messages, to update bit edge messages, as shown in a block 2140. This can also involve performing bit node processing, by employing LLRs, to update bit edge messages, as shown in a block 2142.

The method 2100 then operates by modifying the updated bit edge messages (e.g., using scaling compression, and/or adding a first value to or subtracting a second value from, etc.) before passing the modified, updated bit edge messages for use in check node processing, as shown in a block 2150.

The method 2100 also operates by performing check node processing, by employing most recently modified, updated bit edge messages, to update check edge messages, as shown in a block 2160.

Moreover, if the bit edge messages have undergone compression during the modification in the block 2150, then the method 2100 also involves decompressing (e.g., expanding) those bit edge messages before using them to update check edge messages, as shown in a block 2162.

Referring to the method 2200 of the FIG. 22, the method 2200 operates by receiving LLRs, as shown in a block 2210. Then, the method 2200 operates by initializing bit edge messages using the LLRs, as shown in a block 2220. The method 2200 then operates by modifying the initialized bit edge messages (e.g., using scaling compression, and/or adding a first value to or subtracting a second value from, etc.) before passing the modified, initialized bit edge messages for use in check node processing, as shown in a block 2230.

The method 2200 operates by performing check node processing, by employing the modified, initialized bit edge messages, to update check edge messages, as shown in a block 2240. If the modified, initialized bit edge messages have undergone compression during the modification in the block 2230, then the method 2200 also involves decompressing (e.g., expanding) those modified, initialized bit edge messages before using them to update check edge messages, as shown in a block 2242.

The method 2200 operates by modifying the updated check edge messages (e.g., using scaling compression, and/or adding a first value to or subtracting a second value from, etc.) before passing the modified, updated check edge messages for use in bit node processing, as shown in a block 2250.

The method 2200 also operates by performing bit node processing, by employing the modified, updated check edge messages, to update bit edge messages, as shown in a block 2260. This can also involve performing bit node processing, by employing LLRs, to update bit edge messages, as shown in a block 2262. Alternatively, this can also involve modifying the LLRs before employing them within bit node processing to update bit edge messages, as shown in a block 2266. If the modified, check edge messages have undergone compression during the modification in the block 2250, then the method 2200 also involves decompressing (e.g., expanding) those modified, check edge messages before using them to update bit edge messages, as shown in a block 2264.

The method 2200 also operates by performing check node processing, by employing most recently modified, updated bit edge messages, to update check edge messages, as shown in a block 2270.

It is also noted that the embodiments within the FIG. 19, FIG. 20, FIG. 21, and FIG. 22 are exemplary of some of the possible embodiments that can be performed in accordance with certain aspects of the invention. These embodiments are not exhaustive, and variations of these embodiments can be performed without departing from the scope and spirit of the invention.

FIG. 23, FIG. 24, FIG. 25, FIG. 26, and FIG. 27 illustrate embodiments of a method for performing operational parameter modification as a function of decoding iteration in accordance with LDPC decoding.

Figure 23:
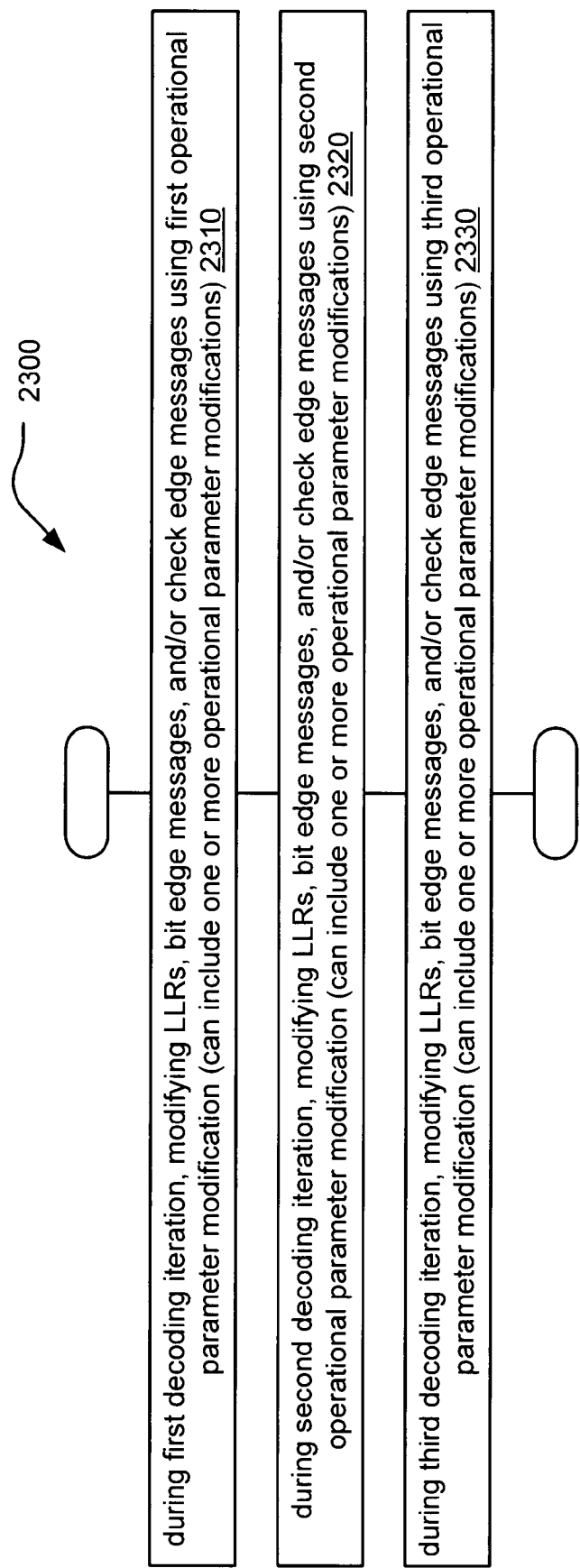
FIG. 23, FIG. 24, FIG. 25, FIG. 26, and FIG. 27 illustrate embodiments of a method for performing operational parameter modification as a function of decoding iteration in accordance with LDPC decoding.

Referring to the method 2300 of FIG. 23, the method 2300 operates during a first decoding iteration by modifying LLRs, bit edge messages, and/or check edge messages using first operational parameter modification (which can include one or more operational parameter modifications), as shown in a block 2310. Then, the method 2300 operates during a second decoding iteration by modifying LLRs, bit edge messages, and/or check edge messages using second operational parameter modification (which can include one or more operational parameter modifications), as shown in a block 2320. The method 2300 also operates during third decoding iteration by modifying LLRs, bit edge messages, and/or check edge messages using third operational parameter modification (can include one or more operational parameter modifications), as shown in a block 2330.

Figure 24:
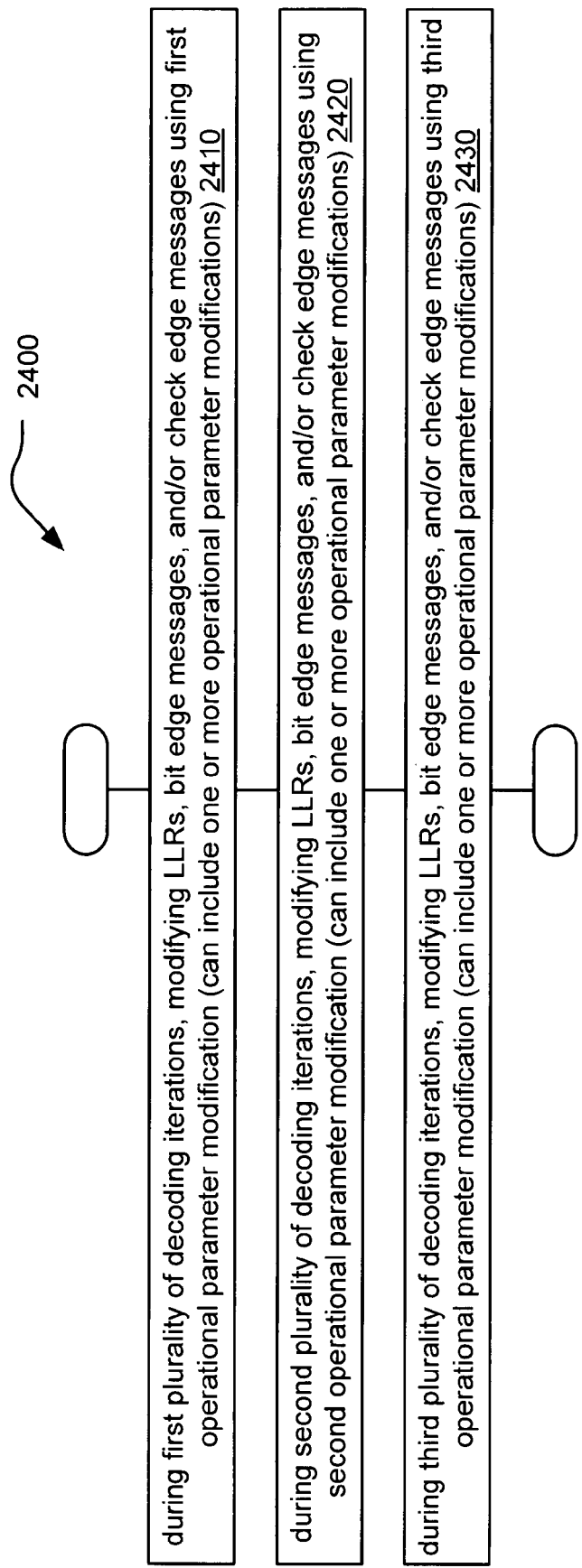

Referring to the method 2400 of FIG. 24, the method 2400 operates during a first plurality of decoding iterations by modifying LLRs, bit edge messages, and/or check edge messages using first operational parameter modification (which can include one or more operational parameter modifications), as shown in a block 2410. Then, the method 2400 operates during a second plurality of decoding iterations by modifying LLRs, bit edge messages, and/or check edge messages using second operational parameter modification (can include one or more operational parameter modifications), as shown in a block 2420. Then, the method 2400 operates during a third plurality of decoding iterations by modifying LLRs, bit edge messages, and/or check edge messages using third operational parameter modification (can include one or more operational parameter modifications), as shown in a block 2430.

Figure 25:
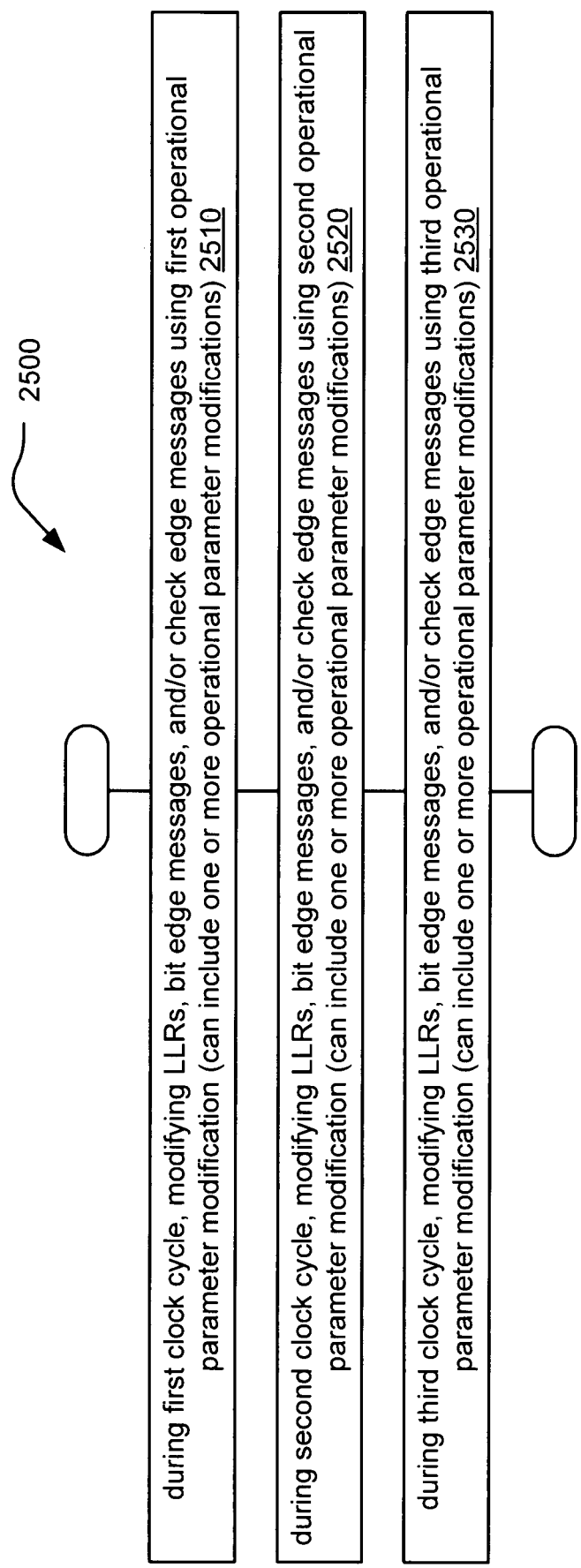

Referring to the method 2500 of FIG. 25, the method 2500 operates during a first clock cycle by modifying LLRs, bit edge messages, and/or check edge messages using first operational parameter modification (which can include one or more operational parameter modifications), as shown in a block 2510. Then, the method 2500 operates during a second clock cycle by modifying LLRs, bit edge messages, and/or check edge messages using second operational parameter modification (which can include one or more operational parameter modifications), as shown in a block 2520. The method 2500 also operates during third clock cycle by modifying LLRs, bit edge messages, and/or check edge messages using third operational parameter modification (can include one or more operational parameter modifications), as shown in a block 2530.

Figure 26:
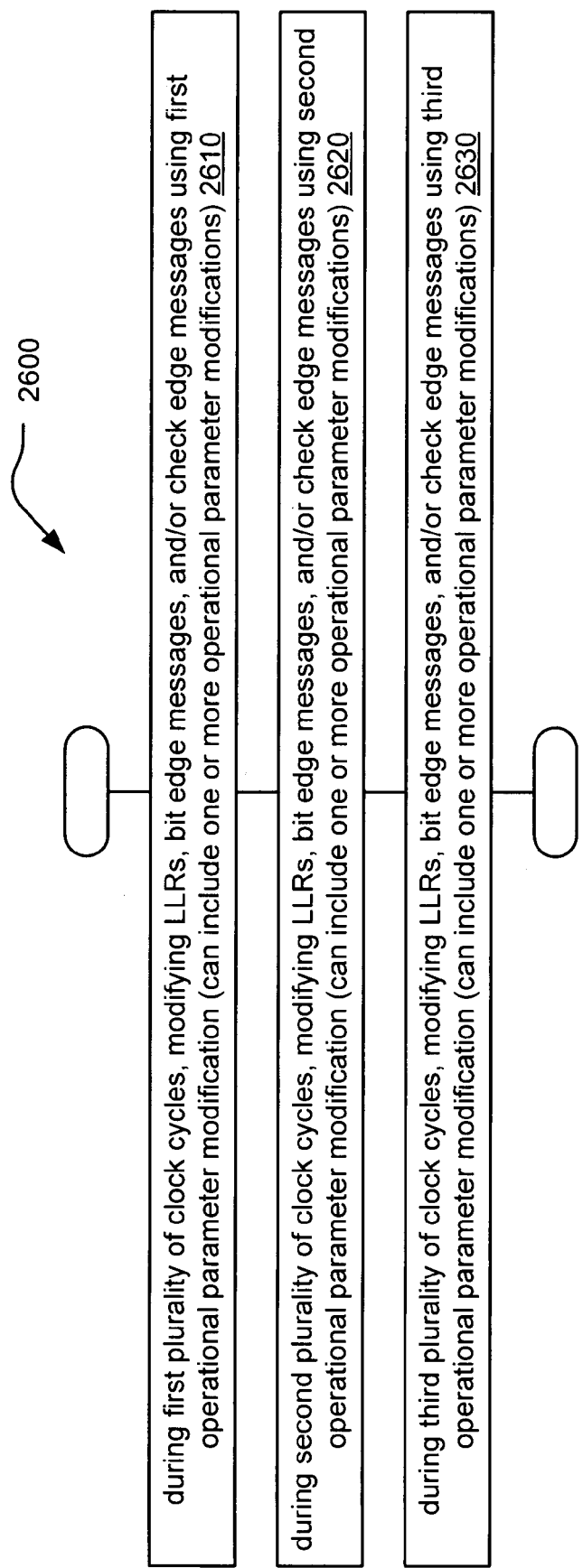

Referring to the method 2600 of FIG. 26, the method 2600 operates during a first plurality of clock cycles by modifying LLRs, bit edge messages, and/or check edge messages using first operational parameter modification (which can include one or more operational parameter modifications), as shown in a block 2610. Then, the method 2600 operates during a second plurality of clock cycles by modifying LLRs, bit edge messages, and/or check edge messages using second operational parameter modification (can include one or more operational parameter modifications), as shown in a block 2620. Then, the method 2600 operates during a third plurality of clock cycles by modifying LLRs, bit edge messages, and/or check edge messages using third operational parameter modification (can include one or more operational parameter modifications), as shown in a block 2630.

Figure 27:
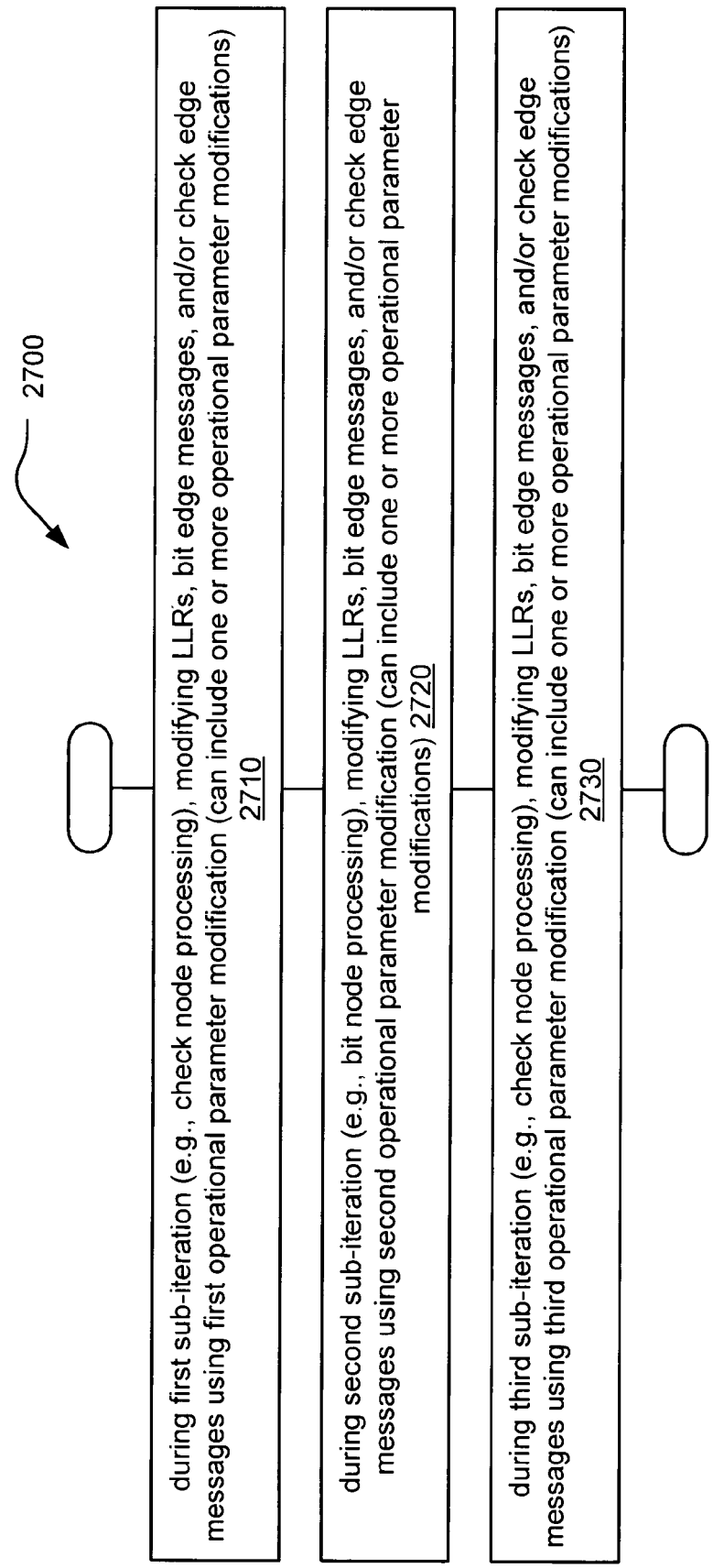

Referring to the method 2700 of FIG. 27, the method 2700 operates during a first sub-iteration (e.g., check node processing) by modifying LLRs, bit edge messages, and/or check edge messages using first operational parameter modification (which can include one or more operational parameter modifications), as shown in a block 2710. Then, the method 2700 operates during a second sub-iteration (e.g., bit node processing) by modifying LLRs, bit edge messages, and/or check edge messages using second operational parameter modification (which can include one or more operational parameter modifications), as shown in a block 2720. The method 2700 also operates during third sub-iteration (e.g., check node processing) by modifying LLRs, bit edge messages, and/or check edge messages using third operational parameter modification (can include one or more operational parameter modifications), as shown in a block 2730.

Some of the following embodiments describe means that allow the number of bits required to represent the messages to be reduced (e.g., via compression) with little or no loss of coding performance over a wide range of operating signal-to-noise ratios (SNRs). This is achieved by optimizing the fixed point representation at each stage of the decoding processing to match the dynamic range requirements, and changing the nature of the decoding processing from iteration to iteration.

Figure 28:
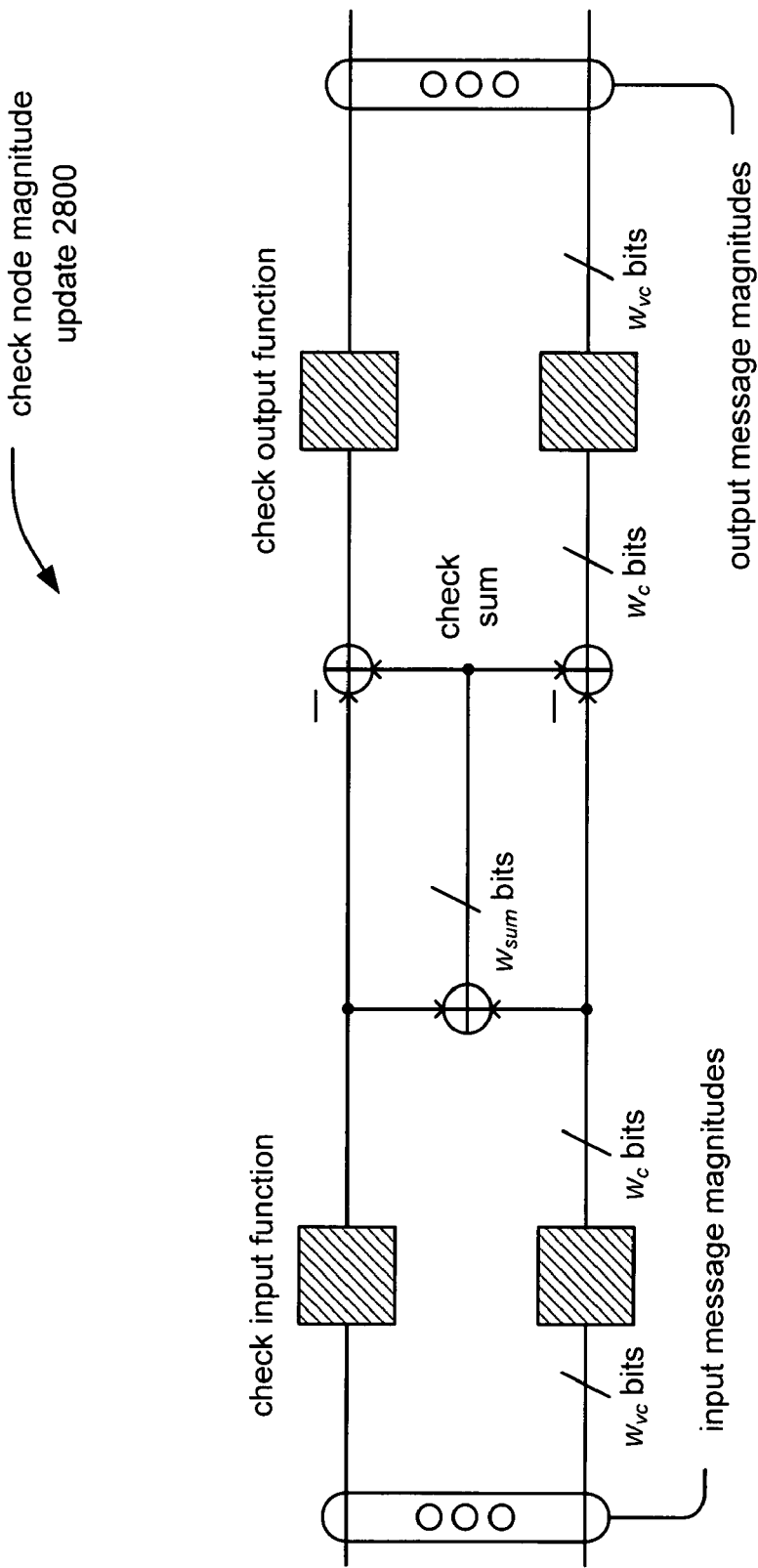
FIG. 28 illustrates an embodiment of check node magnitude update functionality in accordance with LDPC decoding.

FIG. 28 illustrates an embodiment 2800 of check node magnitude update functionality in accordance with LDPC decoding. This embodiment 2800 provides some enhancements to the check node magnitude update processing. In this embodiment 2800, the number of bits used to represent the bit edge messages sent from the bit nodes (e.g., the variable nodes) to the check nodes is denoted, $w_{vc}$. The number of bits used inside each check node to represent each check edge message is, $w_c$. The number of bits used to represent the check edge message sent back to the bit nodes (e.g., the variable nodes) is $w_{cv}$.

The check input function approximates the following equation (7) where the subscript denotes the number of bits use to represent the function input and output. To reduce the input message precision, it is possible to approximate equation (7) such that $w_c \gg w_{vc}$.

$$y_{w_c} = \log\left(\tanh\left(\frac{x_{w_{vc}}}{2}\right)\right) \quad (7)$$

The check output function approximates the following equation (8). To reduce the output message precision it is possible to approximate equation (8) such that $w_c \gg w_{cv}$.

$$z_{w_{cv}} = 2 \tan h^{-1}(\exp(y_{w_c})) \quad (8)$$

If required, the approximations to equation (7) and equation (8) can be chosen so that $w_c \gg w_{cv} = w_{vc}$.

The check input and output functions may be implemented as look up tables or directly instantiated as logic gates.

One approximation for the check input function and the output function that leads to a very efficient logic gate implementation is "powers of two" function as described herein. For example, for $w_{cv} = w_{vc} = 3$ bits, and $w_c = 8$ bits, equation (7) is approximated as Table 1 below, and equation (8) is approximated as Table 2 below.

TABLE 1

Efficient check input function approximation

| x (3 bits) | | | | | | | |
|---|---|---|---|---|---|---|---|
| 0 | 1 | 2 | 3 | 4 | 5 | 6 | 7 |

| y (8 bits) | | | | | | | |
|---|---|---|---|---|---|---|---|
| 128 | 64 | 32 | 16 | 8 | 4 | 2 | 0 |

TABLE 2

Efficient check output function approximation

| y (8 bits) | | | | | | | |
|---|---|---|---|---|---|---|---|
| ≦0 | ≦2 | ≦4 | ≦8 | ≦16 | ≦32 | ≦64 | ≦128 |

| z (3 bits) | | | | | | | |
|---|---|---|---|---|---|---|---|
| 7 | 6 | 5 | 4 | 3 | 2 | 1 | 0 |

The compression of check edge messages can be performed using the powers of two means as shown in the Table 1 (e.g., before performing check node processing). The subsequent decompression/expansion of the updated check edge messages can be performed using the powers of two means as shown in the Table 2 (e.g., after performing check node processing and before passing those updated check edge messages for use in bit node processing).

Also, the approximation of the check input and output function approximation as described above is depicted in FIG. 29.

FIG. 24 illustrates an embodiment 2400 of bit (e.g., variable) node update functionality in accordance with LDPC decoding. This embodiment 2400 provides some enhancements to the bit (e.g., variable) node update processing. In this embodiment 2400, the number of bits used to represent the check edge messages sent from the check nodes to the bit nodes is denoted, $w_{cv}$. The number of bits used inside each bit node to represent each bit edge message is, $w_v$. The number of bits used to represent the bit edge message sent back to the check nodes is $w_{vc}$.

The input scaling is operable to scale the check edge messages sent from the check nodes to the bit nodes. In addition, scaling is performed in the received value (e.g., the LLR that is calculated from the received signal). The output scaling is operable to scale the updated bit edge message that is sent from the bit nodes back to the check nodes.

Figure 29:
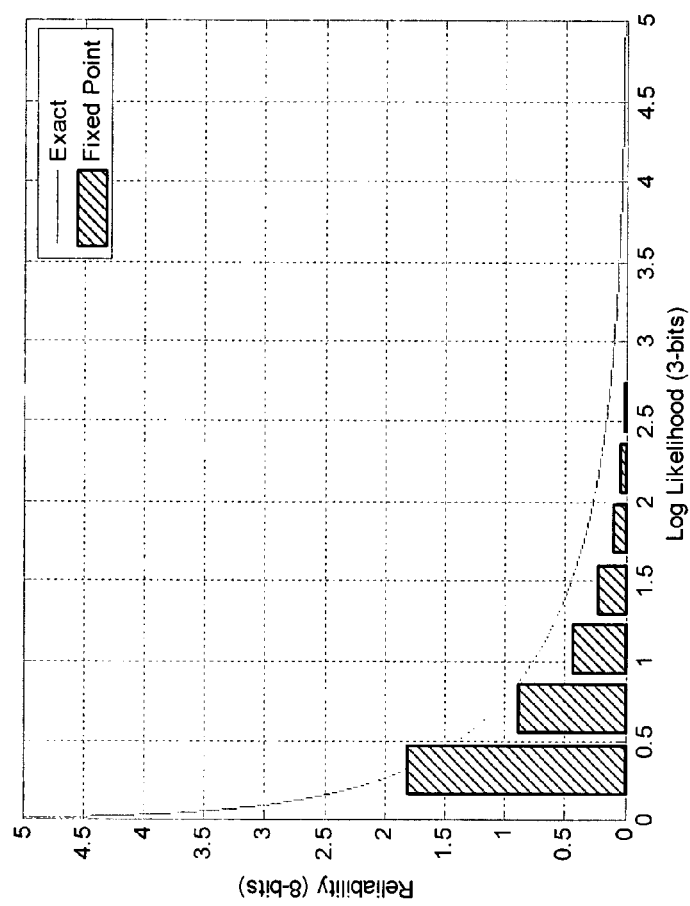
FIG. 29 illustrates an embodiment of check input and output function approximation.
Figure 30:
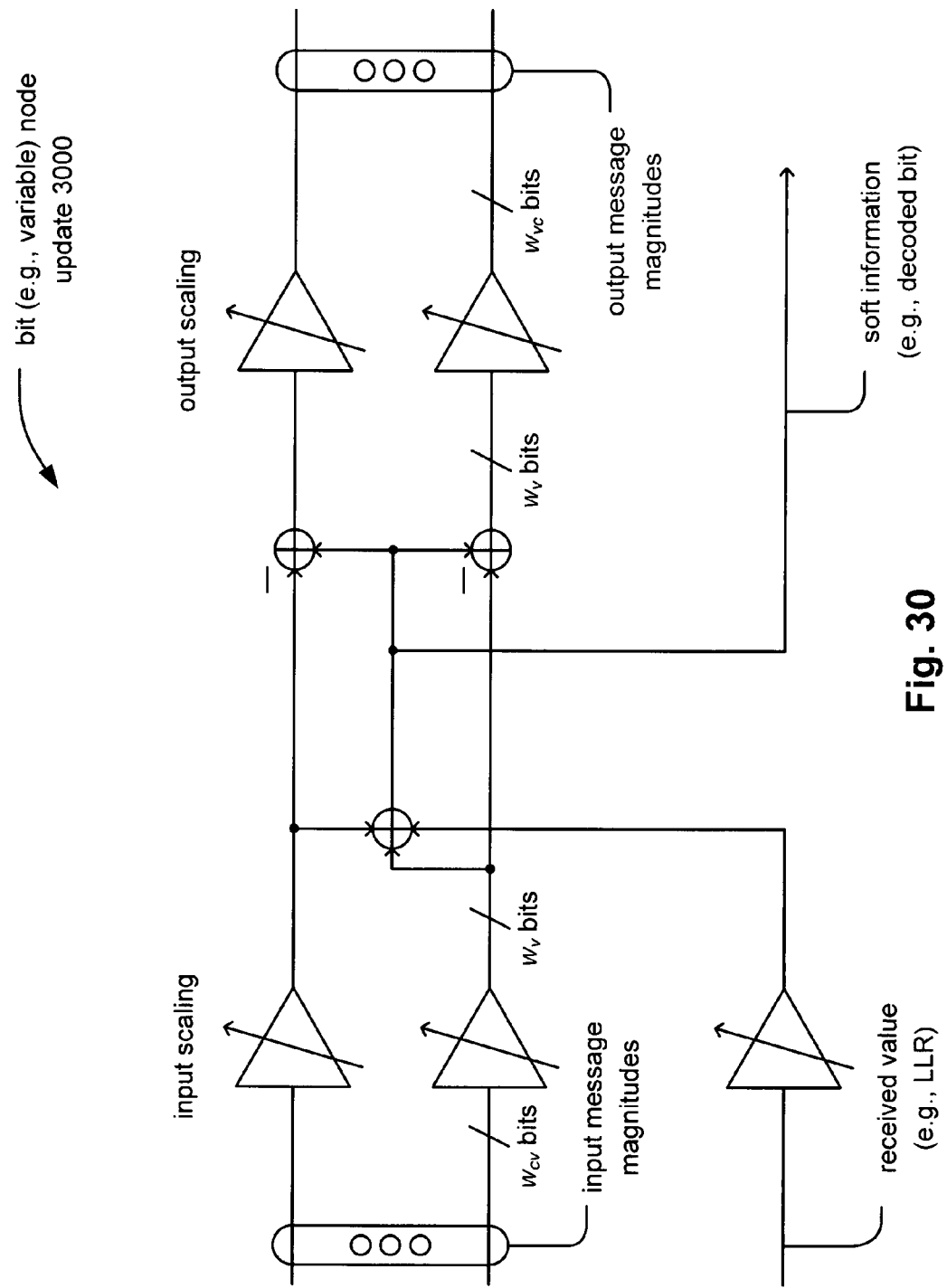
FIG. 30 illustrates an embodiment of bit (e.g., variable) node update functionality in accordance with LDPC decoding.

The impact of the implementation and embodiments described above with respect to FIG. 28 (and improved efficiency as shown by FIG. 29) is operable to reduce the decoder implementation complexity significantly, but may also result in a loss of decoding performance in some situations.

To improve further decoding performance either with or without the implementation and embodiments described above with respect to FIG. 28 (and improved efficiency as shown by FIG. 29), the LDPC decoding processing can perform operational parameter modification as it iterates. For example, the LDPC decoding processing can change to the decoding processing in accordance with any one, combination thereof, or all of the following on a per iteration basis, a plurality of iterations basis, a per clock cycle basis, a plurality of clock cycles basis, and/or a per sub-iteration basis:

1. Change the check input function in the check node update
2. Change the check output function in the check node update
3. Change the scaling of input messages in the variable node update (e.g., the bit node update)
4. Change the scaling of output messages in the variable node update (e.g., the bit node update)
5. Change the scaling of the received log-likelihood value in the variable node update (e.g., the bit node update)
6. Add or subtract a number from any of the check or variable node messages
7. Change the variable node (e.g., bit node) decision logic
8. Modify any one of these operational parameters independently in a per iteration basis, a plurality of iterations basis, a per clock cycle basis, a plurality of clock cycles basis, and/or a per sub-iteration basis (e.g., these operational parameters can all be modified in the same manner or differently)
9.a. Modify different variable (e.g., bit) node updates differently
9.a. Modify different check node updates differently It is noted that the various modules (e.g., encoding modules, decoding modules, bit engines, check engines, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A decoder that is operable to decode an LDPC (Low Density Parity Check) coded signal, the decoder comprising:
  a check engine that is operable to employ a first bit edge message to update a first check edge message thereby generating a second check edge message; and
  a bit engine that is operable to:
    scale the second check edge message thereby generating a scaled second check edge message;
    employ the scaled second check edge message to update a second bit edge message thereby generating a third bit edge message; and
    employ the third bit edge message to generate soft information corresponding to an information bit encoded into the LDPC coded signal; and wherein:
  the soft information corresponding to the information bit encoded into the LDPC coded signal is used to make a best estimate of the information bit encoded into the LDPC coded signal; and wherein:
  the check engine is operable to:
    receive a compressed bit edge message; and
    decompress the compressed bit edge message thereby recovering the first bit edge message for use in updating the first check edge message thereby generating the second check edge message.

2. The decoder of claim 1, wherein:
the check engine is operable to:
  scale a fourth bit edge message thereby generating a scaled fourth bit edge message; and
  employ the scaled fourth bit edge message to update a third check edge message thereby generating a fourth check edge message.

3. The decoder of claim 1, wherein:
during a first decoding iteration, the bit engine is operable to scale the second check edge message according to a first scaling parameter thereby generating the scaled second check edge message; and
during a second decoding iteration, the bit engine is operable to scale a third check edge message according to a second scaling parameter thereby generating a scaled third check edge message.

4. The decoder of claim 1, wherein:
during a first clock cycle, the bit engine is operable to scale the second check edge message according to a first scaling parameter thereby generating the scaled second check edge message; and
during a second clock cycle, the bit engine is operable to scale a third check edge message according to a second scaling parameter thereby generating a scaled third check edge message.

5. The decoder of claim 1, wherein:
during a first sub-iteration of a decoding iteration, the check engine is operable to scale the first bit edge message according to a first scaling parameter; and
during a second sub-iteration of the decoding iteration, the bit engine is operable to scale the second check edge message according to a second scaling parameter thereby generating the scaled second check edge message.

6. The decoder of claim 1, wherein:
during a first decoding iteration, the check engine is operable to scale the first bit edge message according to a first scaling parameter; and
during a second decoding iteration, the check engine is operable to scale the third bit edge message according to a second scaling parameter.

7. The decoder of claim 1, wherein:
the check engine is operable to:
  subtract a value from or add the value to the first bit edge message.

8. The decoder of claim 1, wherein:
the bit engine is operable to:
  subtract a value from or add the value to the scaled second check edge message.

9. The decoder of claim 1, wherein:
the check engine is operable to:
  cyclic shift or round the first bit edge message.

10. The decoder of claim 1, wherein:
the bit engine is operable to:
  cyclic shift or round the scaled second check edge message.

11. The decoder of claim 1, wherein:
the bit engine is operable to:
  subtract a value from or add the value to the second check edge message.

12. The decoder of claim 1, wherein:
the bit engine is operable to:
  receive a log likelihood ratio (LLR) corresponding to the information bit encoded into the LDPC coded signal;
  modify the LLR by at least one of adding a value to or subtracting the value from the LLR and scaling the LLR thereby generating a modified LLR; and employ the modified LLR to update the second bit edge message thereby generating the third bit edge message.

13. The decoder of claim 1, wherein:
the bit engine is operable to:
   modify the third bit edge message by at least one of adding a value to or subtracting the value from the third bit edge message, scaling the third bit edge message, cyclic shifting the third bit edge message, and rounding the third bit edge message thereby generating a modified third bit edge message; and
   pass the modified third bit edge message to the check engine.

14. The decoder of claim 1, wherein:
the bit engine is operable to:
   compress the third bit edge message thereby generating a compressed third bit edge message; and
   pass the compressed third bit edge message to the check engine; and
the check engine is operable to decompress the compressed third bit edge message thereby recovering the third bit edge message for use in updating at least one additional check edge message.

15. The decoder of claim 1, wherein:
the communication device is operable within at least one of a satellite communication system, a wireless communication system, a wired communication system, and a fiber-optic communication system.

16. The decoder of claim 1, wherein:
the check engine is operable to:
   compress the second check edge message thereby generating a compressed second check edge message; and
   pass the compressed second check edge message to the bit engine; and
the bit engine is operable to:
   receive the compressed second check edge message; and
   decompress the compressed second check edge message thereby recovering the second check edge message.

17. The decoder of claim 1, wherein:
the check engine is operable to:
   compress the second check edge message using a powers of two function thereby generating a compressed second check edge message; and
   pass the compressed second check edge message to the bit engine; and
the bit engine is operable to:
   receive the compressed second check edge message; and
   decompress the compressed second check edge message thereby recovering the second check edge message.

18. The decoder of claim 1, wherein:
the check engine is operable to:
   decompress the compressed bit edge message using a powers of two function thereby recovering the first bit edge message for use in updating the first check edge message thereby generating the second check edge message.

19. The decoder of claim 1, wherein:
the decoder is implemented within a communication device that is operable to receive the LDPC coded signal from a communication channel; and
the communication device is implemented within at least one of a satellite communication system, a wireless communication system, a wired communication system, and a fiber-optic communication system.

20. A decoder that is operable to decode an LDPC (Low Density Parity Check) coded signal, the decoder comprising:
a check engine that is operable:
   employ a first bit edge message to update a first check edge message thereby generating a second check edge message; and
   modify the second check edge message by performing at least one of adding a value to or subtracting the value from the second check edge message, scaling the second check edge message, shifting the second check edge message, rounding the second check edge message, and compressing the second check edge message thereby generating a modified second check edge message; and
a bit engine that is operable to:
   receive the modified second check edge message;
   if the modified second check edge message has undergone compressing by the check engine, decompress the modified second check edge message thereby generating a decompressed, modified second check edge message;
   employ the modified second check edge message or the decompressed, modified second check edge message to update a second bit edge message thereby generating a third bit edge message; and
   employ the third bit edge message to generate soft information corresponding to an information bit encoded into the LDPC coded signal; and wherein:
the soft information corresponding to the information bit encoded into the LDPC coded signal is used to make a best estimate of the information bit encoded into the LDPC coded signal.

21. The decoder of claim 20, wherein:
the bit engine is operable to:
   receive the modified second check edge message;
   modify the modified second check edge message by performing at least one of adding at least one additional value to or subtracting the at least one additional value from the modified second check edge message, scaling the modified second check edge message, and decompressing the modified second check edge message thereby generating a twice modified second check edge message; and
   employ the twice modified second check edge message to update the second bit edge message thereby generating the third bit edge message.

22. The decoder of claim 20, wherein:
the value is a first value;
the check engine is operable to:
   modify the first bit edge message by at least one of adding a second value to or subtracting the second value from the first bit edge message and scaling the first bit edge message thereby generating a modified first bit edge message; and
   employ the modified first bit edge message to update the first check edge message thereby generating the second check edge message.

23. The decoder of claim 20, wherein:
the value is a first value;
during a first decoding iteration, the check engine is operable to:
   modify the first bit edge message by at least one of adding a second value to or subtracting the second value from the first bit edge message and scaling the first bit edge message according to a first scaling parameter thereby generating a modified first bit edge message; and employ the modified first bit edge message to update the first check edge message thereby generating the second check edge message; and during a second decoding iteration, the check engine is operable to:
  modify the third bit edge message by at least one of adding a third value to or subtracting the third value from the third bit edge message and scaling the third bit edge message according to a second scaling parameter thereby generating a modified third bit edge message; and
  employ the modified third bit edge message to update the at least one additional check edge message.

24. The decoder of claim 20, wherein:
the bit engine is operable to:
  receive a log likelihood ratio (LLR) corresponding to the information bit encoded into the LDPC coded signal;
  modify the LLR by at least one of adding a value to or subtracting the value from the LLR and scaling the LLR thereby generating a modified LLR; and
  employ the modified LLR to update the second bit edge message thereby generating the third bit edge message.

25. The decoder of claim 20, wherein:
the value is a first value;
the bit engine is operable to:
  modify the third bit edge message by at least one of adding a second value to or subtracting the second value from the third bit edge message, scaling the third bit edge message, and compressing the third bit edge message thereby generating a modified third bit edge message; and
  pass the modified third bit edge message to the check engine.

26. The decoder of claim 20, wherein:
the compressing the second check edge message is performed using a powers of two function.

27. The decoder of claim 20, wherein:
the decoder is implemented within a communication device that is operable to receive the LDPC coded signal from a communication channel; and
the communication device is implemented within at least one of a satellite communication system, a wireless communication system, a wired communication system, and a fiber-optic communication system.

28. A decoder that is operable to decode an LDPC (Low Density Parity Check) coded signal, the decoder comprising:
a check engine that is operable to employ a first bit edge message to update a first check edge message thereby generating a second check edge message; and
a bit engine that is operable to:
  modify the second check edge message by performing at least one of adding a value to or subtracting the value from the second check edge message, scaling the second check edge message, cyclic shifting the second check edge message, rounding the second check edge message, and decompressing the second check edge message thereby generating a modified second check edge message;
  employ the modified second check edge message to update a second bit edge message thereby generating a third bit edge message; and
  employ the third bit edge message to generate soft information corresponding to an information bit encoded into the LDPC coded signal; and wherein:

the soft information corresponding to the information bit encoded into the LDPC coded signal is used to make a best estimate of the information bit encoded into the LDPC coded signal; and
the check engine is operable to:
  compress the second check edge message using a powers of two function thereby generating a compressed second check edge message; and
  pass the compressed second check edge message to the bit engine.

29. The decoder of claim 28, wherein:
the value is a first value;
the check engine is operable to:
  modify the first bit edge message by at least one of adding a second value to or subtracting the second value from the first bit edge message and scaling the first bit edge message thereby generating a modified first bit edge message; and
  employ the modified first bit edge message to update the first check edge message thereby generating the second check edge message.

30. The decoder of claim 28, wherein:
the value is a first value;
during a first decoding iteration, the check engine is operable to:
  modify the first bit edge message by at least one of adding a second value to or subtracting the second value from the first bit edge message and scaling the first bit edge message according to a first scaling parameter thereby generating a modified first bit edge message; and
  employ the modified first bit edge message to update the first check edge message thereby generating the second check edge message; and
during a second decoding iteration, the check engine is operable to:
  modify the third bit edge message by at least one of adding a third value to or subtracting the third value from the third bit edge message and scaling the third bit edge message according to a second scaling parameter thereby generating a modified third bit edge message; and
  employ the modified third bit edge message to update at least one additional check edge message.

31. The decoder of claim 28, wherein:
the value is a first value;
during a first clock cycle, the check engine is operable to:
  modify the first bit edge message by at least one of adding a second value to or subtracting the second value from the first bit edge message and scaling the first bit edge message according to a first scaling parameter thereby generating a modified first bit edge message; and
  employ the modified first bit edge message to update the first check edge message thereby generating the second check edge message; and
during a second clock cycle, the check engine is operable to:
  modify the third bit edge message by at least one of adding a third value to or subtracting the third value from the third bit edge message and scaling the third bit edge message according to a second scaling parameter thereby generating a modified third bit edge message; and
  employ the modified third bit edge message to update at least one additional check edge message.

32. The decoder of claim 28, wherein:
the value is a first value;
during a first sub-iteration, the check engine is operable to:
  modify the first bit edge message by at least one of adding a second value to or subtracting the second value from the first bit edge message and scaling the first bit edge message according to a first scaling parameter thereby generating a modified first bit edge message; and
  employ the modified first bit edge message to update the first check edge message thereby generating the second check edge message; and
during a second sub-iteration, the check engine is operable to:
  modify the third bit edge message by at least one of adding a third value to or subtracting the third value from the third bit edge message and scaling the third bit edge message according to a second scaling parameter thereby generating a modified third bit edge message; and
  employ the modified third bit edge message to update at least one additional check edge message.

33. The decoder of claim 28, wherein:
the bit engine is operable to:
  receive a log likelihood ratio (LLR) corresponding to the information bit encoded into the LDPC coded signal;
  modify the LLR by at least one of adding a value to or subtracting the value from the LLR and scaling the LLR thereby generating a modified LLR; and
  employ the modified LLR to update the second bit edge message thereby generating the third bit edge message.

34. The decoder of claim 28, wherein:
the bit engine is operable to:
  modify the third bit edge message by at least one of adding at least one additional value to or subtracting the at least one additional value from the third bit edge message and scaling the third bit edge message thereby generating a modified third bit edge message; and
  pass the modified third bit edge message to the check engine.

35. The decoder of claim 28, wherein:
the bit engine is operable to:
  compress the third bit edge message thereby generating a compressed third bit edge message; and
  pass the compressed third bit edge message to the check engine; and
the check engine is operable to decompress the compressed third bit edge message thereby recovering the third bit edge message for use in updating at least one additional check edge message.

36. The decoder of claim 28, wherein:
the check engine is operable to:
  receive a compressed bit edge message; and
  decompress the compressed bit edge message thereby recovering the first bit edge message for use in updating the first check edge message thereby generating the second check edge message.

37. The decoder of claim 28, wherein:
the check engine is operable to:
  receive a compressed bit edge message; and
  decompress the compressed bit edge message using a powers of two function thereby recovering the first bit edge message for use in updating the first check edge message thereby generating the second check edge message.

38. The decoder of claim 28, wherein:
the check engine is operable to:
  receive a compressed bit edge message;
  decompress the compressed bit edge message thereby recovering the first bit edge message for use in updating the first check edge message thereby generating the second check edge message;
  compress the second check edge message thereby generating the compressed second check edge message; and
  pass the compressed second check edge message to the bit engine; and
the bit engine is operable to:
  receive the compressed second check edge message; and
  decompress the compressed second check edge message thereby recovering the second check edge message.

39. The decoder of claim 28, wherein:
the communication device is operable within at least one of a satellite communication system, a wireless communication system, a wired communication system, and a fiber-optic communication system.

40. The decoder of claim 28, wherein:
the decoder is implemented within a communication device that is operable to receive the LDPC coded signal from a communication channel; and
the communication device is implemented within at least one of a satellite communication system, a wireless communication system, a wired communication system, and a fiber-optic communication system.

41. A method for decoding an LDPC (Low Density Parity Check) coded signal, the method comprising:
receiving a compressed bit edge message;
decompressing the compressed bit edge message thereby recovering a first bit edge message;
operating a check engine for performing check node processing by employing the first bit edge message to update a first check edge message thereby generating a second check edge message;
operating a bit engine for modifying the second check edge message by performing at least one of adding a value to or subtracting the value from the second check edge message, scaling the second check edge message, cyclic shifting the second check edge message, rounding the second check edge message, and decompressing the second check edge message thereby generating a modified second check edge message;
operating the bit engine for performing bit node processing by employing the modified second check edge message to update a second bit edge message thereby generating a third bit edge message;
employ the third bit edge message to generate soft information corresponding to an information bit encoded into the LDPC coded signal; and
using the soft information corresponding to the information bit encoded into the LDPC coded signal to make a best estimate of the information bit encoded into the LDPC coded signal.

42. The method of claim 41, wherein:
the value is a first value; and further comprising:
modifying the first bit edge message by at least one of adding a second value to or subtracting the second value from the first bit edge message and scaling the first bit edge message thereby generating a modified first bit edge message; and performing check node processing by employing the modified first bit edge message to update the first check edge message thereby generating the second check edge message.

43. The method of claim 41, wherein:

the value is a first value; and further comprising:

during a first decoding iteration:
modifying the first bit edge message by at least one of adding a second value to the first bit edge message, subtracting the second value from the first bit edge message, and scaling the first bit edge message according to a first scaling parameter thereby generating a modified first bit edge message; and
performing check node processing by employing the modified first bit edge message to update the first check edge message thereby generating the second check edge message; and during a second decoding iteration:
modifying the third bit edge message by at least one of adding a third value to the third bit edge message, subtracting the third value from the third bit edge message, and scaling the third bit edge message according to a second scaling parameter thereby generating a modified third bit edge message; and
performing check node processing by employing the modified third bit edge message to update at least one additional check edge message.

44. The method of claim 41, wherein:

the value is a first value; and further comprising:

during a first clock cycle:
modifying the first bit edge message by at least one of adding a second value to the first bit edge message, subtracting the second value from the first bit edge message, and scaling the first bit edge message according to a first scaling parameter thereby generating a modified first bit edge message; and
performing check node processing by employing the modified first bit edge message to update the first check edge message thereby generating the second check edge message; and during a second clock cycle:
modifying the third bit edge message by at least one of adding a third value to the third bit edge message, subtracting the third value from the third bit edge message, and scaling the third bit edge message according to a second scaling parameter thereby generating a modified third bit edge message; and
performing check node processing by employing the modified third bit edge message to update at least one additional check edge message.

45. The method of claim 41, wherein:

the value is a first value; and further comprising:

during a first sub-iteration:
modifying the first bit edge message by at least one of adding a second value to the first bit edge message, subtracting the second value from the first bit edge message, and scaling the first bit edge message according to a first scaling parameter thereby generating a modified first bit edge message; and
performing check node processing by employing the modified first bit edge message to update the first check edge message thereby generating the second check edge message; and during a second sub-iteration:
modifying the third bit edge message by at least one of adding a third value to the third bit edge message, subtracting the third value from the third bit edge message, and scaling the third bit edge message according to a second scaling parameter thereby generating a modified third bit edge message; and
performing check node processing by employing the modified third bit edge message to update at least one additional check edge message.

46. The method of claim 41, further comprising:

receiving a log likelihood ratio (LLR) corresponding to the information bit encoded into the LDPC coded signal;
modify the LLR by at least one of adding a value to the LLR, subtracting the value from the LLR, and scaling the LLR thereby generating a modified LLR; and
performing bit node processing by employ the modified LLR to update the second bit edge message thereby generating the third bit edge message.

47. The method of claim 41, further comprising:

modifying the third bit edge message by at least one of adding at least one additional value to the third bit edge message, subtracting the at least one additional value from the third bit edge message, and scaling the third bit edge message thereby generating a modified third bit edge message.

48. The method of claim 41, further comprising:

compressing the third bit edge message thereby generating a compressed third bit edge message;
passing the compressed third bit edge message for use in check node processing; and
decompressing the compressed third bit edge message thereby recovering the third bit edge message for use in updating at least one additional check edge message.

49. The method of claim 41, further comprising:

the communication device is operable within at least one of a satellite communication system, a wireless communication system, a wired communication system, and a fiber-optic communication system.

50. The method of claim 41, further comprising:

receiving a compressed bit edge message;
decompressing the compressed bit edge message thereby recovering the first bit edge message for use in updating the first check edge message thereby generating the second check edge message;
compressing the second check edge message thereby generating a compressed second check edge message;
passing the compressed second check edge message for use in bit node processing;
receiving the compressed second check edge message; and
decompressing the compressed second check edge message thereby recovering the second check edge message.

51. The method of claim 41, wherein:

the method is performed in a decoder;
the decoder is implemented within a communication device that is operable to receive the LDPC coded signal from a communication channel; and
the communication device is implemented within at least one of a satellite communication system, a wireless communication system, a wired communication system, and a fiber-optic communication system.

* * * * *